US007884459B2

(12) United States Patent
Yoshida et al.

(10) Patent No.: US 7,884,459 B2

(45) Date of Patent: Feb. 8, 2011

(54) SEMICONDUCTOR DEVICE SUITABLE FOR A STACKED STRUCTURE

(75) Inventors: Eiji Yoshida, Kawasaki (JP); Takao Ohno, Kawasaki (JP); Yoshito Akutagawa, Kawasaki (JP); Koji Sawahata, Kawasaki (JP); Masataka Mizukoshi, Kawasaki (JP); Takao Nishimura, Kawasaki (JP); Akira Takashima, Kawasaki (JP); Mitsuhisa Watanabe, Aizuwakamatsu (JP)

(73) Assignee: Fujitsu Semiconductor Limited, Yokohama (JP)

( * ) Notice: Subject to any disclaimer, the term of this patent is extended or adjusted under 35 U.S.C. 154(b) by 107 days.

(21) Appl. No.: 12/210,645

(22) Filed: Sep. 15, 2008

(65) Prior Publication Data

US 2009/0008798 A1 Jan. 8, 2009

Related U.S. Application Data

(60) Division of application No. 11/062,735, filed on Feb. 23, 2005, now abandoned, which is a continuation of application No. PCT/JP03/00283, filed on Jan. 15, 2003.

(51) Int. Cl.
*H01L 23/02* (2006.01)

(52) U.S. Cl. ....................... 257/686; 257/270; 257/277; 257/E21.614; 438/109

(58) Field of Classification Search ................. 257/276, 257/686
See application file for complete search history.

(56) References Cited

U.S. PATENT DOCUMENTS

| | | | | |
|---|---|---|---|---|
| 4,751,562 | A | 6/1988 | Yamamura | |
| 5,028,986 | A | 7/1991 | Sugano et al. | |
| 6,372,620 | B1 | 4/2002 | Oosawa et al. | |
| 7,196,418 | B2 * | 3/2007 | Ohno et al. | 257/723 |
| 2001/0008794 | A1 | 7/2001 | Akagawa | |

FOREIGN PATENT DOCUMENTS

| | | | |
|---|---|---|---|
| JP | 62-154637 | A | 7/1987 |
| JP | 5-63138 | A | 3/1993 |
| JP | 8-213427 | A | 8/1996 |
| JP | 8-306724 | A | 11/1996 |
| JP | 10-223833 | A | 8/1998 |
| JP | 11-251320 | A | 9/1999 |
| JP | 2000-277689 | A | 10/2000 |
| JP | 2001-060654 | A | 3/2001 |
| JP | 2001-094039 | A | 4/2001 |

* cited by examiner

*Primary Examiner*—Ajay K Arora
(74) *Attorney, Agent, or Firm*—Westerman, Hattori, Daniels & Adrian, LLP

(57) ABSTRACT

A semiconductor device is provided that forms a three-dimensional semiconductor device having semiconductor devices stacked on one another. In this semiconductor device, a hole is formed in a silicon semiconductor substrate that has an integrated circuit unit and an electrode pad formed on a principal surface on the outer side. The hole is formed by etching, with the electrode pad serving as an etching stopper layer. An embedded electrode is formed in the hole. This embedded electrode serves to electrically lead the electrode pad to the principal surface on the bottom side of the silicon semiconductor substrate.

9 Claims, 26 Drawing Sheets

SEMICONDUCTOR DEVICE SUITABLE FOR A STACKED STRUCTURE

CROSS-REFERENCE TO RELATED APPLICATION

This application is a divisional of U.S. patent application Ser. No. 11/062,735, filed on Feb. 23, 2005, which is a U.S. continuation application filed under 35 USC 111(a) claiming benefit under 35 USC 120 and 365(c) of PCT International Application No. PCT/JP03/00283 filed on Jan. 15, 2003, all of which are hereby incorporated herein by reference.

BACKGROUND OF THE INVENTION

The present invention generally relates to semiconductor devices, three-dimensional semiconductor devices, and methods of manufacturing semiconductor devices, and, more particularly, to a semiconductor device that is suitable for a stacked structure, a three-dimensional semiconductor device that is formed by stacking the semiconductor devices on one another, and a method of manufacturing the semiconductor device.

In recent years, three-dimensional semiconductor devices in which semiconductor devices are stacked on one another have been developed as highly-integrated, smaller semiconductor components. To produce a three-dimensional semiconductor device with higher reliability, highly reliable electric connection between the stacked semiconductor devices is essential. To achieve the highly reliable electric connection between the stacked semiconductor devices, highly reliable electrode parts formed through the substrate of each semiconductor device are essential.

Japanese Laid-Open Patent Application No. 2000-277689 discloses a semiconductor device having a three-dimensional structure.

In the formation of the semiconductor device having a three-dimensional structure disclosed in the publication, holes that penetrate not only a thinned semiconductor substrate having semiconductor devices formed thereon but also electrode pads are formed at the locations on the semiconductor substrate corresponding to the electrode pads of the semiconductor devices. After the holes are filled with resin, through holes are formed in the resin, and the through holes are filled with a conductive material to form via wiring plugs. The semiconductor substrate is then diced into semiconductor devices, thereby forming three-dimensional semiconductor chips.

The semiconductor chips are stacked on one another. Electric connection between the vertically aligned semiconductor chips is obtained by connecting the via wiring plugs to one another with soldering balls or stud bumps.

In this structure, the through holes are formed in the electrode pads, and the via wiring plugs are formed in the through holes with resin layers. Therefore, it is necessary to employ an electric connection part between each electrode pad and the corresponding via wiring plug. As a result, an increase in the connection resistance cannot be avoided between each electrode pad and the corresponding via wiring plug.

Also, having a through electrode in the middle, each of the electrode pads has a smaller area, resulting in difficulties in wire bonding and connecting with other electrodes.

Japanese Laid-Open Patent Application No. 2001-94039 discloses a structure in which semiconductor chips each having a protruding electrode formed on a principal surface are stacked up. More specifically, after the semiconductor chips are stacked up, vertical holes that penetrate the protruding electrodes and the semiconductor chips of the stacked structure are formed, and conductive members are formed in the hole with insulating layers. Also, through holes are formed under the respective protruding electrodes of the semiconductor chips each having the protruding electrode on a principal surface. Conductive members are formed in the through holes with insulating layers. The semiconductor chips having the protruding electrodes and the conductive members in the through holes are stacked up in this structure.

In this structure, the through holes are formed in the respective semiconductor chips after the protruding electrodes are formed on the surfaces of the respective semiconductor chips. Therefore, it is difficult to form the through holes, while maintaining the flatness of each semiconductor chip.

The through hole formed in each semiconductor chip has a high aspect ratio, and is vertically formed. Therefore, it is difficult to form an insulating layer and a conductive layer with sufficient thicknesses in each through hole.

Japanese Laid-Open Patent Application No. 10-223833 discloses a structure in which an insulating layer is formed on the device forming surface of a silicon substrate. More specifically, a vertical hole that penetrates the insulating layer and reaches a certain depth in the silicon substrate is formed. The hole is filled with metal, and a pad is formed over the holes. The silicon substrate is then thinned from the bottom surface, so as to expose the filling metal layer. Thus, a through plug is formed.

After the formation of the through plug, a circuit is formed on the device forming surface. Such silicon substrates are stacked up.

In this structure, the through hole formed in the semiconductor chip has a high aspect ratio, and is vertically formed. Therefore, it is difficult to form an insulating layer and a conductive layer with sufficient thicknesses in each through hole.

Japanese Laid-Open Patent Application No. 8-306724 discloses a structure in which an etching hole that reaches the non-circuit forming surface (the bottom surface) of a semiconductor chip is formed in the vicinity of an electrode pad on the circuit pattern forming surface of the semiconductor chip. The etching hole is filled with a conductive material, and an external terminal is provided on the bottom surface of the semiconductor chip. Such semiconductor chips are stacked on one another in this structure.

In this structure, each through hole is formed at a distance from each corresponding electrode pad. As a result, each semiconductor chip takes up a large area. Therefore, this structure is not suitable for high integration.

Japanese Laid-Open Patent Application No. 11-251320 discloses a structure in which a through hole is formed from the bottom surface to the upper surface of a silicon substrate. A through contact region is formed in the through hole with an insulating layer, and an electronic component formed on the upper surface of the silicon substrate is connected to the through contact region via a metal layer. Thus, the electronic component is electrically led to the bottom surface of the silicon substrate.

In this prior art, the technique of stacking up semiconductor devices is not mentioned, and the structure having a through hole in the electrode pad area of a semiconductor substrate is not suggested.

Among the conventional semiconductor devices having three-dimensional structures, each memory three-dimensional semiconductor device has a chip select unit that designates a memory semiconductor chip to perform data read and write operations among stacked memory semiconductor chips. Such a conventional memory three-dimensional semiconductor device has a chip select circuit as the chip select unit formed in each memory semiconductor chip. The chip select circuit is formed on the integrated circuit forming surface of each memory semiconductor chip. As a result, each of the memory semiconductor chips becomes larger in size, and the memory three-dimensional semiconductor device becomes larger in size on a plan view. In accordance with this prior art, it is difficult to produce a small-sized memory three-dimensional semiconductor device.

SUMMARY OF THE INVENTION

A general object of the present invention is to provide semiconductor devices, three-dimensional semiconductor devices, and methods of manufacturing semiconductor devices in which the above disadvantages are eliminated.

A more specific object of the present invention is to provide semiconductor devices (semiconductor chips), a three-dimensional structure formed with the semiconductor devices, and a method of manufacturing the semiconductor devices that can reduce the connection resistance between the stacked semiconductor chips and realize a stacked structure with higher density.

The above objects of the present invention are achieved by a semiconductor device that includes: a substrate that has first and second surfaces; an integrated circuit unit and an electrode pad on the first surface; and a lead-out unit that has one end electrically connected to the bottom surface of the electrode pad and the other end exposed to the second surface of the substrate, the electrode pad being electrically led out to the second surface of the substrate, the lead-out unit being formed in a hole that is in the form of a concavity extending from the second surface of the substrate and penetrating the substrate, the bottom surface of the electrode pad being exposed through the bottom of the hole.

In accordance with the present invention, the electrode pad is not broken, and an unnecessary increase is not caused in the resistance of the electrode pad. Also, the upper surface of the electrode pad can be used for wire bonding.

The above objects of the present invention are also achieved by a three-dimensional semiconductor device that includes semiconductor devices that are stacked on one another. Each of the semiconductor devices includes: a substrate that has first and second surfaces; an integrated circuit unit and an electrode pad on the first surface; and a lead-out unit that is formed in a hole in the substrate and electrically leads the electrode pad to the second surface of the substrate. In this three-dimensional semiconductor device, the electrode pads of the semiconductor devices are electrically connected to one another and are stacked on one another.

In accordance with the present invention, the electrode pads are not broken, and electric connection can be maintained between stacked semiconductor devices, utilizing the upper surface of each electrode pad. Also, as the electrode pads are not broken, an unnecessary increase is not caused in the resistance of each electrode pad.

The above objects of the present invention are also achieved by a method of manufacturing a semiconductor device, including the steps of: bonding a first surface of a semiconductor substrate to a supporting plate member; thinning the semiconductor substrate by grinding the second surface of the semiconductor substrate; forming a hole by etching the second surface of the thinned semiconductor substrate, the hole penetrating the substrate and exposing the bottom surface of the electrode pad at the bottom; and forming a lead-out unit in the hole.

In accordance with the present invention, a semiconductor device that is thinner than the original crystals of a semiconductor substrate obtained by slicing single-crystalline ingot can be manufactured. As the lead-out unit is formed after the semiconductor substrate is thinned, the formation of the hole in the semiconductor substrate can be carried out in a short period of time.

The above and other objects and features of the present invention will become more apparent from the following description taken in conjunction with the accompanying drawings.

DESCRIPTION OF THE PREFERRED EMBODIMENTS

The following is a description of embodiments of the present invention, with reference to the accompanying drawings.

First Embodiment

Figure 1:
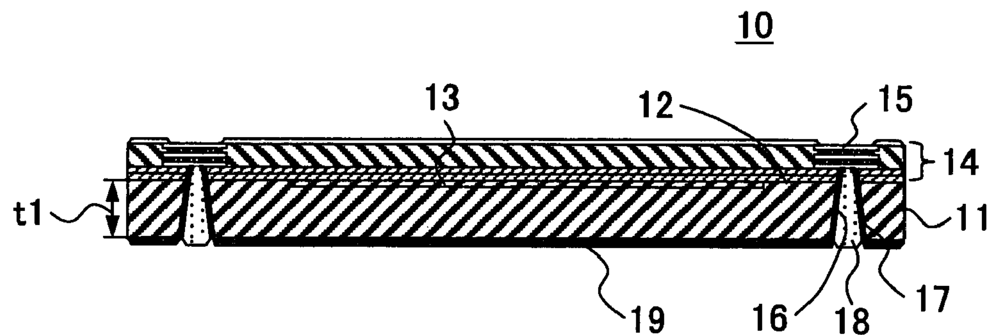
FIG. 1 illustrates a semiconductor device in accordance with a first embodiment of the present invention.
Figure 2:
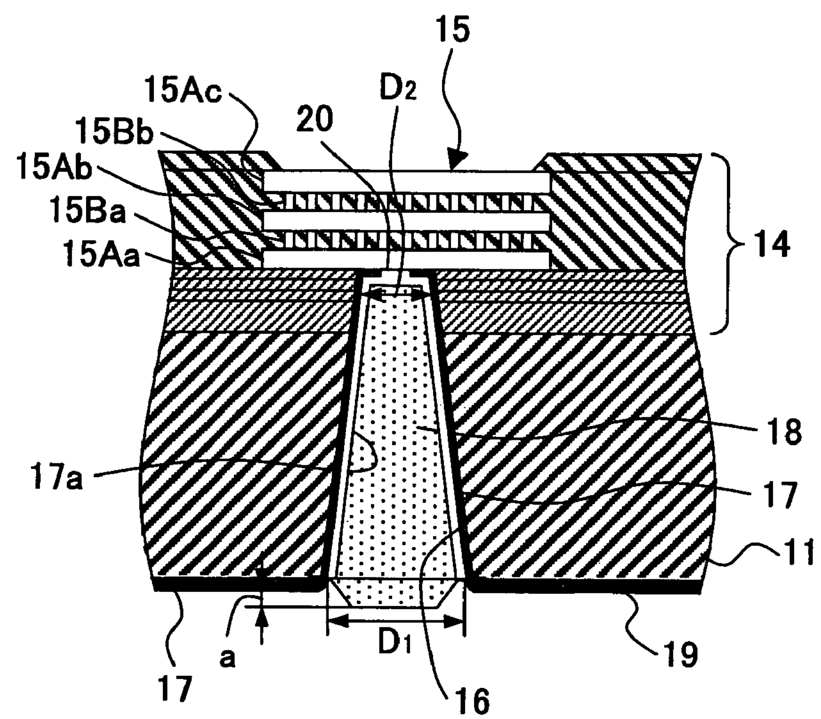
FIG. 2 is an enlarged view of the through electrode and the electrode pad shown in FIG. 1.

FIG. 1 illustrates the structure of a semiconductor device in accordance with a first embodiment of the present invention. FIG. 2 is a partially enlarged cross-sectional view of the semiconductor device.

The semiconductor device 10 shown in FIG. 1 has an electronic circuit unit (an integrated circuit unit) 13 that includes an active element, a passive element, and an electrode/wiring layer. The electronic circuit unit 13 is formed on a principal surface of a thin silicon semiconductor substrate 11. The wiring layer lead out from the electronic circuit unit 13 extends in an insulating layer, and is electrically connected to an electrode pad 15.

The semiconductor substrate 11 has a hole 16 formed at the location corresponding to the electrode pad 15. This hole 16 does not penetrate the electrode pad 15.

An embedded electrode 18 is provided in the hole 16 via an insulating layer 17 and a base (seed) metal layer 17*a*. The insulating layer 17 is formed to cover the inner surface of the hole 16. One end of the embedded electrode 18 is electrically connected to the electrode pad 15, and the other end of the embedded electrode 18 slightly protrudes from the other principal surface 19 of the semiconductor substrate 11. The embedded electrode 18 is equivalent to the "lead-out part" in claims.

In the semiconductor device 10 in accordance with this embodiment, the embedded electrode 18 penetrates the semiconductor substrate 11, but does not penetrate the electrode pad 15. The electrode pad 15 is electrically connected to the embedded electrode 18 through an opening 20 formed in the insulating layer 17 under the lower surface (the semiconductor substrate side) of the electrode pad 15. Accordingly, the embedded electrode 18 and the electrode pad 15 can be connected to each other with low resistance.

As the upper surface of the electrode pad 15 remains flat, wire bonding to the upper surface or connection to another electrode can be easily performed.

To form the semiconductor device 10 in accordance with the present invention, the active element, the passive element, and the electronic circuit unit (the integrated circuit unit) 13 including the electrode/wiring layer are formed on the principal surface 12 of the semiconductor substrate (a wafer) 11 with a round shape by a known wafer processing technique.

Here, the electrode pad 15 is formed at the same time as the formation of the electrode and the wiring of the electronic circuit unit 13. Therefore, the electrode pad 15 includes three aluminum (Al) layers 15Aa, 15Ab, and 15Ac, and tungsten (W) plugs 15Ba, 15Bb, and 15Bc that are formed between the aluminum layers, as shown in FIG. 2.

However, a semiconductor device in accordance with the present invention does not necessarily have a multi-layer structure.

A plating layer that includes a gold (Au) uppermost layer and a nickel (Ni)/copper (Cu)/titanium (Ti) base layer is formed on the surface of the aluminum uppermost layer 15Ac, if necessary.

The other principal surface 19 of the semiconductor substrate 11 is then subjected to grinding by a known technique, so that the thickness of the semiconductor substrate 11 becomes 25 μm to 100 μm.

Selective etching is then performed on the location of the thin semiconductor substrate 11 corresponding to the electrode pad 15, thereby forming the through hole 16 that penetrates the semiconductor substrate 11 and the insulating layer 14, and reaches the lowermost aluminum layer 15Aa of the electrode pad 15. The selective etching may be performed by a known photoetching technique.

As a result of this, the lower surface of the lowermost aluminum layer 15Aa of the electrode pad 15 is exposed.

The hole 16 is etched so as to have a greater diameter (diameter D1) on the side of the other principal surface 19 of the semiconductor substrate 11 than the diameter (diameter D2) on the side of the principal surface 12 (on the side of the electrode pad 15). Thus, the hole 16 is formed as a tapered structure (a conic structure).

As described above, since the semiconductor substrate 11 is a thin structure, the etching can be performed with high precision in a short period of time.

The insulating layer 17 that is approximately 1 μm in thickness and is made of silicon oxide ($SiO_2$) is formed to cover the semiconductor substrate 11, the aluminum layer 15Aa, and the insulating layer 14 that are exposed to the hole 16.

The insulating layer 17 may be a silicon nitride ($Si_3N_4$) layer, instead. The insulating layer 17 may be formed using a sputtering technique or a chemical vapor deposition (CVD) technique.

Since the hole 16 has a tapered structure (a conic structure) that is open on the bottom surface of the semiconductor substrate 11, the insulating layer 17 is formed to have a uniform thickness. The insulating layer 17 also covers the other principal surface 19 of the semiconductor substrate 11.

Selective etching is then performed to selectively remove the insulating layer 17 from the location corresponding to the aluminum layer 15Aa of the electrode pad 15 in the hole 16, so as to form the opening 20.

The hole 16 is then filled with copper (Cu), so as to form the embedded electrode 18.

One end of the embedded electrode 18 is electrically connected to the electrode pad 15, and the other end of the embedded electrode 18 slightly protrudes from the other principal surface 19 of the semiconductor substrate 11 by a height "a" (=5 μm to 15 μm).

In this manner, the electrode pad 15 provided on the side of the principal surface 12 of the semiconductor substrate 11 can be electrically lead out to the other principal surface 19 of the semiconductor device 11 via the embedded electrode 18.

The formation of the embedded electrode 18 can be carried out by an electroplating technique. In this electroplating process, a base layer is formed in advance by an electroless plating technique, if necessary.

As described above, since the semiconductor substrate 11 has a thin structure, the electroplating can be performed in a short period of time.

A plating layer that includes a gold (Au) surface layer and a nickel (Ni) base layer is formed on the surface of the protruding part of the embedded electrode 18. The thickness of the nickel layer is approximately 2 μm, and the thickness of the gold layer is approximately 0.5 μm.

The round-shaped semiconductor substrate 11 is then subjected to dicing also using a known technique, so as to form individual semiconductor devices (semiconductor chips) 10.

Second Embodiment

Figure 3:
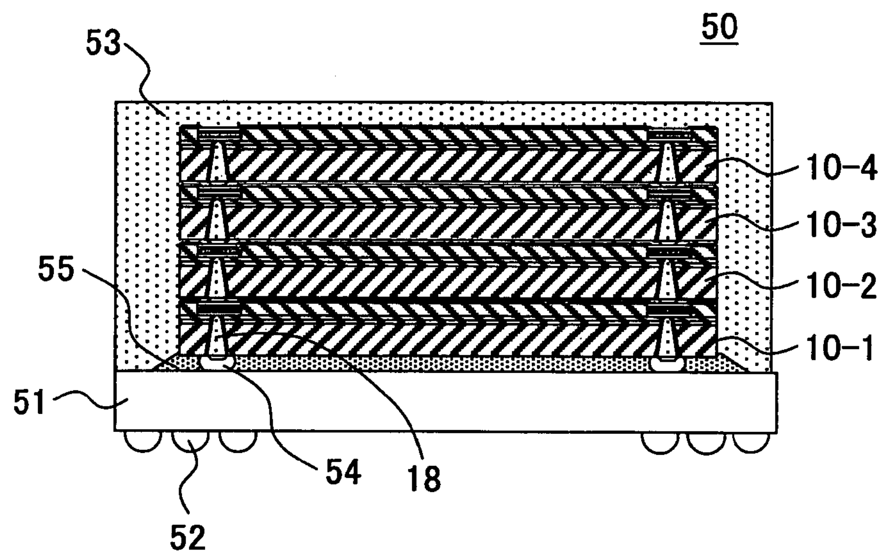
FIG. 3 illustrates a three-dimensional semiconductor device in accordance with a second embodiment of the present invention.

FIG. 3 illustrates the structure of a three-dimensional semiconductor device 50 as a second embodiment of the present invention. This three-dimensional semiconductor device 50 is formed with the semiconductor device 10 with the above described structure in accordance with the present invention.

Figure 4:
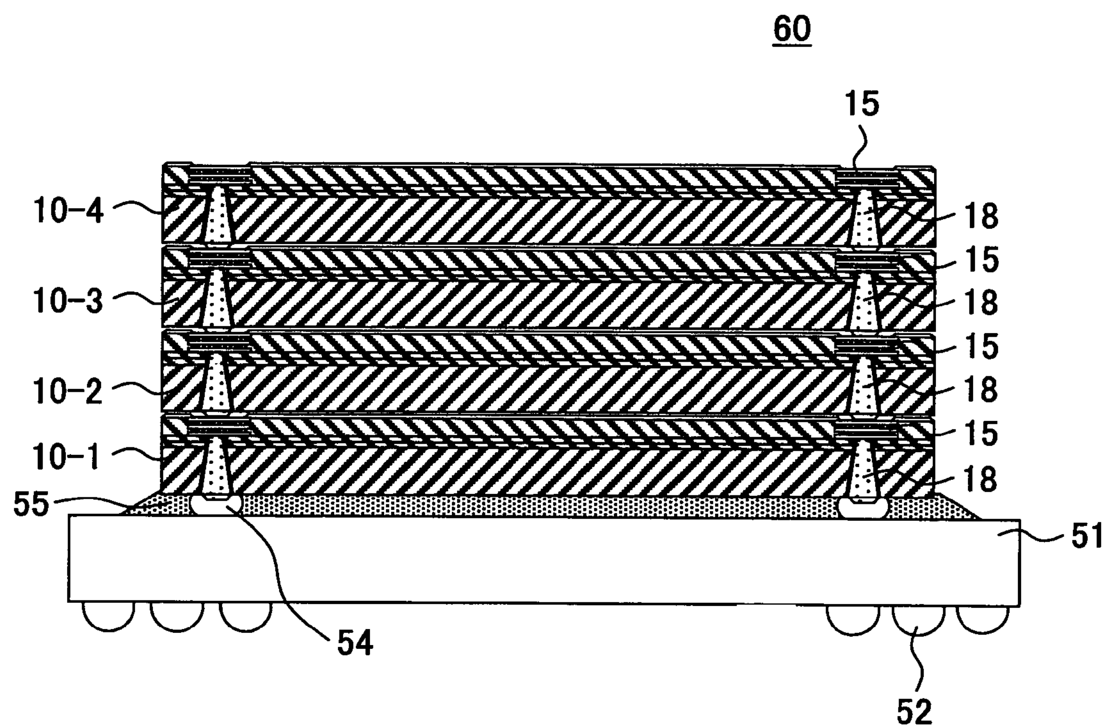
FIG. 4 is an enlarged view of the device main body shown in FIG. 3.

FIG. 4 is an enlarged cross-sectional view of the substantial part of the semiconductor device 50, which is a semiconductor device laminated body.

In accordance with this embodiment, the semiconductor device 50 has an insulating resin sheet as a base member, and a supporting substrate (an interposer) 51 that has an electrode/wiring layer formed on the surface and/or in the inside thereof. A plural number (four (10-1 through 10-4) in FIGS. 3 and 4) of semiconductor devices 10 of the first embodiment are laminated and mounted on a principal surface of the supporting substrate 51. An external connection terminal 52 is provided on the other principal surface of the supporting substrate 51.

The laminated body of the semiconductor devices 10 is packaged and sealed with epoxy resin 53.

This structure is formed by stacking the semiconductor devices 10 one by one on a principal surface of the supporting substrate (the interposer) 51, or stacking and fixing a desired number of semiconductor devices 10 in advance and mounting and fixing the stacked structure to a principal surface of the supporting substrate 51, followed by resin packaging.

The embedded electrode 18 of the lowermost semiconductor device 10-1 is electrically and mechanically connected to the electrode on the surface of the supporting substrate 51 with a solder bump 54. The embedded electrode 18 is also secured with a resin member (an underfill) 55 that fills the gap between the semiconductor device 10-1 and the supporting substrate 51.

The embedded electrode 18 of the semiconductor device 10-2 is mechanically and electrically connected to the electrode pad 15 of the semiconductor device 10-1 by ultrasonic connecting or thermocompression bonding.

An underfill may be provided between the semiconductor devices 10-1 and 10-2, if necessary.

The semiconductor devices 10-3 and 10-4 that are provided on the semiconductor device 10-2 are stacked and secured in the same manner as described above.

In this semiconductor device 50, the semiconductor devices 10 each having a thin semiconductor substrate and an embedded electrode penetrating the semiconductor substrate 51 are employed. Accordingly, the stacked body can be made lower, and high-density mounting can be realized.

Also, as the height (or the length) of each embedded electrode is small, the resistance is lowered, and each semiconductor device can be operated at a higher speed.

The electrode pad 15 of the uppermost semiconductor device 10-4 is wire-bonded to the electrode pad (not shown) of the supporting substrate 51, so that the uppermost semiconductor device 10-4 can be electrically connected to the supporting substrate 51.

Third Embodiment

Figure 5:
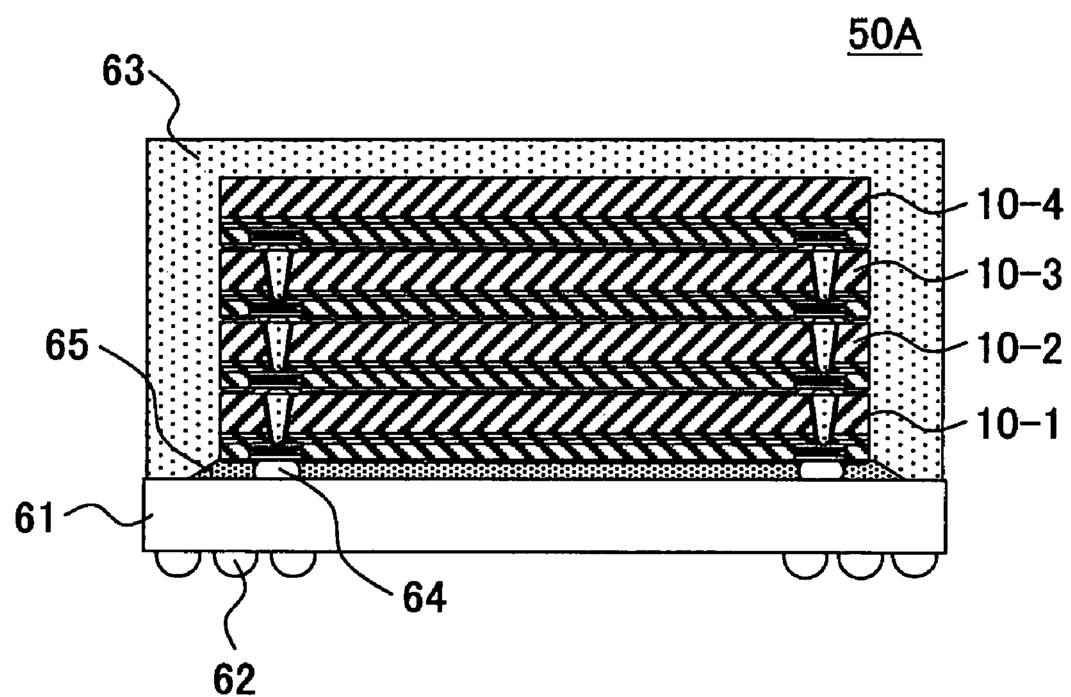
FIG. 5 illustrates a three-dimensional semiconductor device in accordance with a third embodiment of the present invention.

FIG. 5 illustrates a third embodiment of the present invention. The third embodiment is a modification of the three-dimensional semiconductor device having the semiconductor devices 10 in accordance with the present invention.

In this embodiment, a semiconductor device 50A has an insulating resin sheet as a base member, and a supporting substrate (an interposer) 61 that has an electrode/wiring layer formed on the surface and/or in the inside thereof. A plural number (four (10-1 through 10-4) in FIG. 5) of semiconductor devices 10 of the first embodiment are laminated and mounted on a principal surface of the supporting substrate 61. An external connection terminal 62 is provided on the other principal surface of the supporting substrate 61.

The laminated body of the semiconductor devices 10 is packaged and sealed with epoxy resin 63.

In FIG. 5, reference numeral 64 indicates a solder bump, and reference numeral 65 indicates an underfill that is made of resin.

This embodiment differs from the second embodiment in that the semiconductor device 10-1 is mounted upside down onto the supporting substrate 61.

The semiconductor devices 10-2, 10-3, and 10-4 are also mounted upside down onto the semiconductor device 10-1.

In this structure, an embedded electrode does not need to be provided in the uppermost semiconductor device 10-4. Thus, the production costs can be reduced.

Next, the method of manufacturing the semiconductor devices 10 in accordance with the present invention is described in detail.

FIGS. 6A through 8E illustrate the procedures for manufacturing semiconductor devices each having an embedded electrode in accordance with the present invention.

Using a known wafer processing technique, a silicon semiconductor substrate 101 that has electronic circuit units (integrated circuit units) 103 formed on a principal surface 102 thereof is prepared. Each of the electronic circuit units 103 includes an active element, a passive element, and an electrode/wiring layer. In each of the electronic circuit units 103, a wiring layer that is lead out from the corresponding electrode circuit unit 103 extends in an insulating layer 104. Thus, the silicon semiconductor substrate 101 is electrically connected to an electrode pad 105.

Figure 6A:
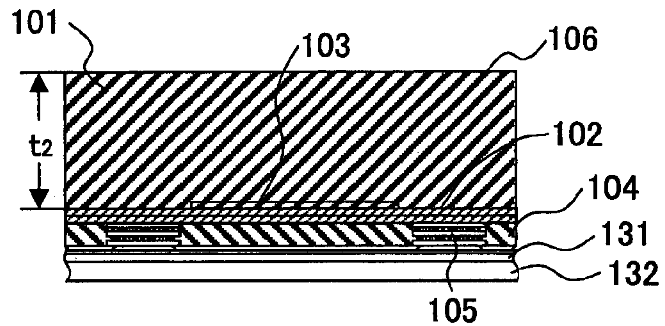
FIGS. 6A through 6D illustrate the procedures for manufacturing the semiconductor device shown in FIG. 1.

As shown in FIG. 6A, a supporting substrate 132 is fixed onto the principal surface 102 of the semiconductor substrate 101 with double-faced adhesive tape 131.

Here, the double-faced tape 131 must be easily detachable from the semiconductor substrate 101 after subjected to high vacuum and temperature profiling in the embedded electrode forming process that follows. For example, a thermal foaming tape that decreases its adhesiveness at a certain temperature, such as Revaalpha (trademark) manufactured by Nitto Denko Corporation, or an UV tape that decreases its adhesiveness through UV radiation, such as an UV tape manufactured by Sekisui Chemical Co., Ltd. may be employed.

The supporting substrate 132 is made of a material that exhibits rigidity even when the semiconductor substrate 101 is thinned in a later procedure, such as quartz glass, Pyrex glass, a silicon plate, or a metal plate. The supporting substrate 132 should be 0.5 mm to 1.0 mm in thickness.

Figure 6B:
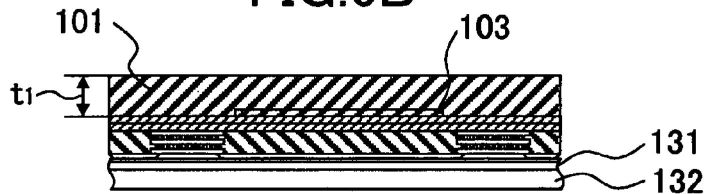

The other principal surface (the bottom surface) 106 of the semiconductor 101 is then subjected to grinding by a known grinding technique, so as to reduce the thickness of the semiconductor substrate 101, as shown in FIG. 6B.

In the above described wafer processing procedure, the silicon semiconductor substrate 101 has a thickness t2 of 725 μm (8 inch diameter) or 625 μm (6 inch diameter). After the grinding procedure, the thickness of the silicon semiconductor substrate becomes t1=25 μm to 100 μm.

After that, so as to remove the grinding damage or stress, light etching or polishing may be performed on the ground surface of the semiconductor substrate 101, if necessary.

Figure 6C:
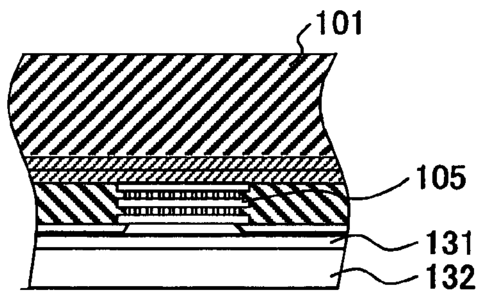

FIG. 6C is an enlarged view of the electrode pad 105 and the surrounding area of the ground semiconductor substrate 101.

In the present invention, a photoresist layer is formed on the bottom surface 106 of the semiconductor substrate 101, and the portion of the semiconductor substrate 101 corresponding to the electrode pad 105 is subjected to selective etching using a known photo-processing technique.

More specifically, a photoresist pattern is selectively formed (not shown) so that an opening can be formed at the location on the bottom surface 106 corresponding to the electrode pad 105. With the resist pattern serving as a mask, dry etching using a fluorine-based gas as the etchant gas is performed to form a hole 107 that extends from the bottom surface 106 of the semiconductor substrate 101 to the lower surface of the electrode pad 105 (on the side of the semiconductor substrate 101).

Here, the electrode pad 105 serves as an etching stopper layer. Since the semiconductor substrate 101 is thin, the etching can be completed in a short period of time.

After the etching, the photoresist is removed.

Figure 6D:
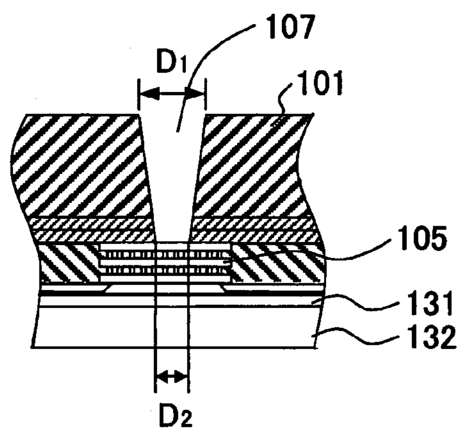

FIG. 6D illustrates the etching process.

The hole 107 has a greater diameter on the side of the bottom surface 106 of the semiconductor substrate 101 than on the side of the electrode pad 105. Accordingly, the hole 107 has a tapered structure or a conic structure.

Where the size of each electrode pad is 90 μm and the interval between each two electrode pads is 135 μm, the diameter D1 of the hole 107 on the side of the bottom surface 106 of the semiconductor substrate 101 can be made 80 μmϕ, and the diameter D2 of the hole 107 on the side of the electrode pad 105 can be made 50 μmϕ.

Figure 7A:
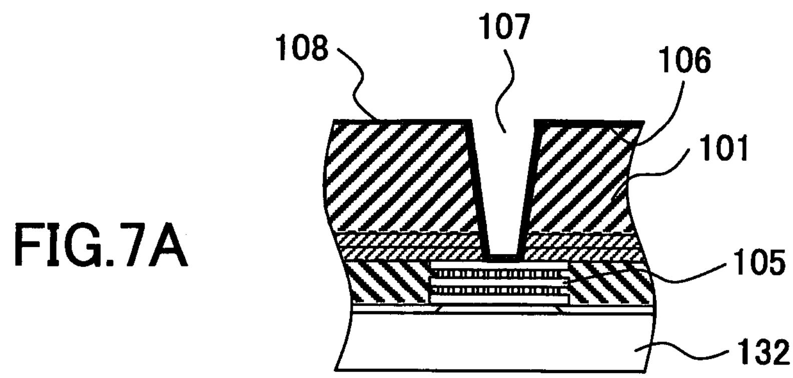
FIGS. 7A through 7D illustrate the procedures for manufacturing the semiconductor device, continued from FIG. 6D.

An insulating layer 108 is then formed to cover the inner surface of the hole 107 and the bottom surface 106 of the semiconductor substrate 101. FIG. 7A illustrates this process.

The insulating layer 108 is to prevent the embedded electrode from having unnecessary continuity to the semiconductor substrate 101 when the embedded electrode is provided in the hole 107. The insulating layer 108 may be a 1 μm thick silicon oxide film or silicon nitride film.

The insulating layer 108 is formed by a known sputtering technique or a known chemical vapor deposition (CVD) technique. Using a sputtering technique, the temperature increase is restricted to a maximum of 80° C., and the double-faced adhesive tape 131 can be protected from thermal impact.

Figure 7B:
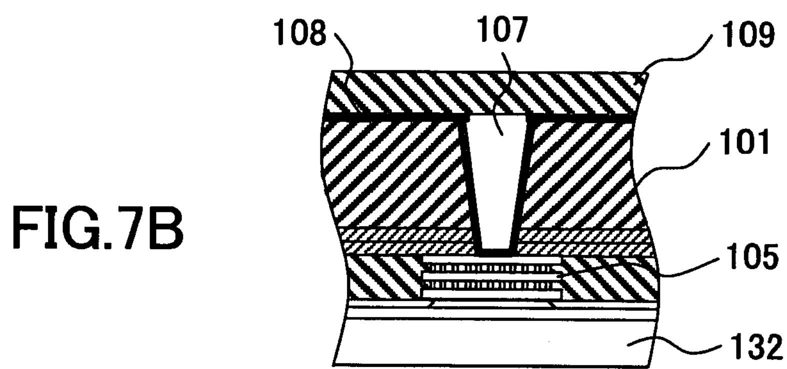

In accordance with the present invention, a dry film 109 is then formed to cover the hole 107 and adhere to the bottom surface 106 of the semiconductor substrate 101, as shown in FIG. 7B.

Figure 7C:
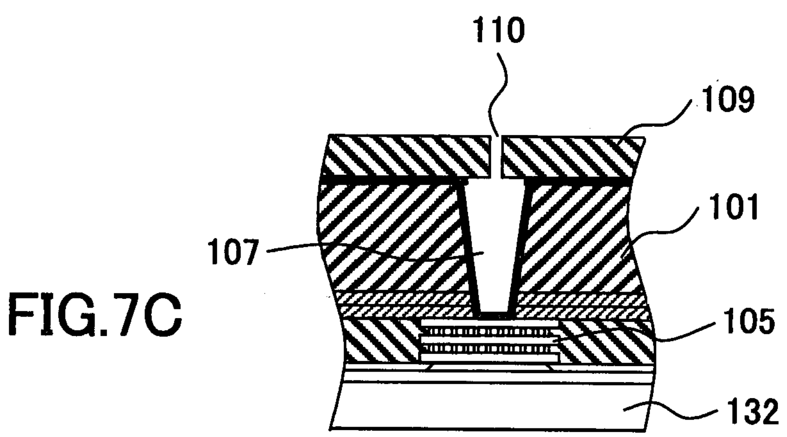

A through hole 110 is then formed at the portion of the dry film 109 corresponding to the hole 107 and the center of the electrode pad 105, as shown in FIG. 7C.

The diameter of the through hole 110 is approximately 30 μm.

Where electric contact between the electrode pad 105 and the embedded electrode is not desired in the hole 107, the through hole 110 is not formed in the dry film 109.

Figure 7D:
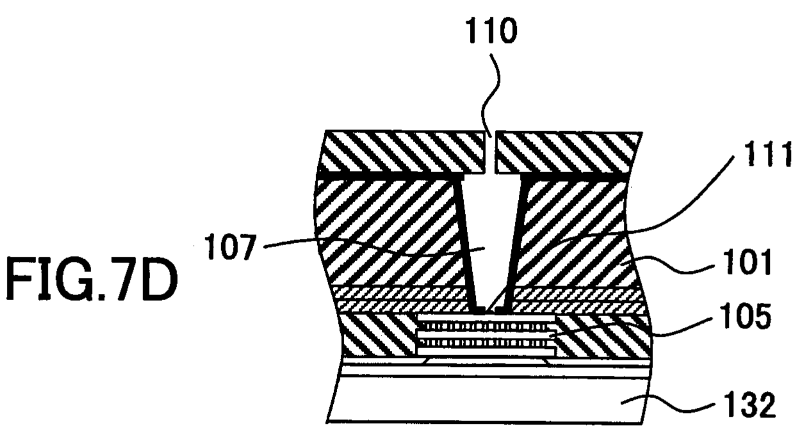

With the dry film 109 serving as a mask, anisotropic dry etching is performed to selectively remove the insulating layer 108 covering the surface of the electrode pad 105. Thus, an opening 111 is formed as shown in FIG. 7D.

Figure 8A:
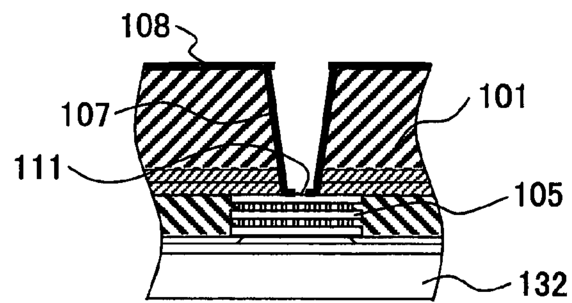
FIGS. 8A through 8E illustrate the procedures for manufacturing the semiconductor device, continued from FIG. 7D.

The dry film 109 is then removed as shown in FIG. 8A.

In FIG. 8A, the electrode pad 105 is exposed to the hole 107 through the opening 111 formed in the insulating layer 108.

A base (seed) metal layer 112 for electroplating is then formed in the hole 107 and on the bottom surface 106 of the semiconductor substrate 101. This base metal layer 112 is in contact with the exposed portion of the electrode pad 105 in the through hole 111.

The base metal layer 112 includes a 2 μm thick titanium (Ti) layer (a base layer) and a 0.5 μm thick copper (Cu) layer (an upper layer). These layers can be formed by a sputtering technique.

Figure 8B:
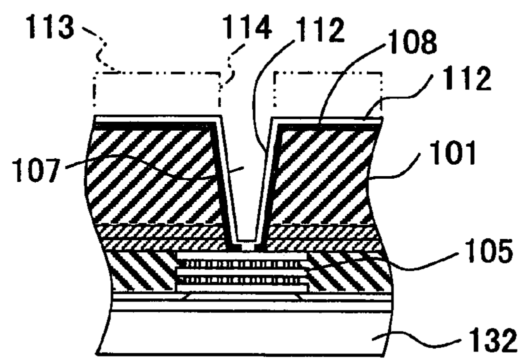

A dry film 113 is then formed to cover the hole 107 and adhere to the bottom surface 106 of the semiconductor substrate 101, and an opening 114 is formed at the portion of the dry film 113 corresponding to the region on which the embedded electrode is to be formed. This process is shown in FIG. 8B.

With the dry film 113 serving as a mask, electroplating is performed to fill the hole 107 with metal, thereby forming an embedded electrode 115.

The metal to fill the hole 107 in the electroplating may suitably be copper (Cu) or the like, because plating is easy to perform with copper and electric resistance can be lowered with copper.

Further, a plating layer that includes a gold (Au) surface layer and a nickel (Ni) base layer is formed on the surface of the embedded electrode 115, if necessary. The thickness of the nickel layer is approximately 2 μm, and the thickness of the gold layer is approximately 0.5 μm.

Figure 8C:
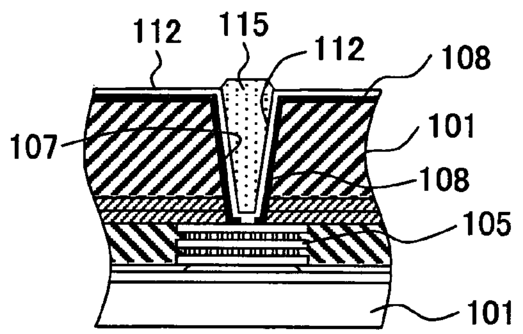

The dry film 113 is then removed as shown in FIG. 8C.

Figure 8D:
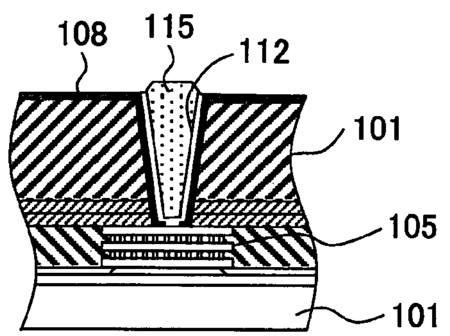
Figure 8E:
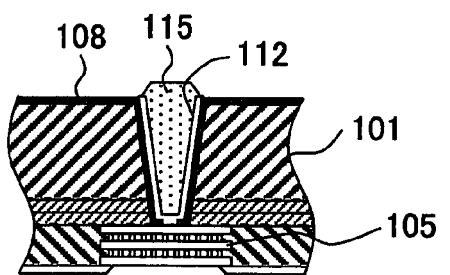

The base (seed) metal layer 112 remaining around the embedded electrode 115 is removed to expose the insulating layer 108. As a result, the embedded electrode 115 protrudes from the bottom surface 106 of the semiconductor substrate 101 by a height of 5 μm to 15 μm as shown in FIG. 8D.

The semiconductor substrate 101 is then diced into electrode circuit units (integrated circuit units) by a known dicing technique. Before or after the dicing, the double-faced adhesive tape 131 is removed. Thus, the semiconductor device 10 shown in FIG. 8E that is the same as the semiconductor device 10 of the first embodiment is obtained.

In the above described embodiments of the present invention, the embedded electrode is formed in accordance with the location of the electrode pad. Therefore, so as to obtain electric connection among stacked semiconductor devices 10, it is necessary to stack the electrode pads on one another at the same locations. This requirement can be easily satisfied in the case of a combination of semiconductor devices with similar functions and operations such as semiconductor memories. However, in the case of a combination of semiconductor devices including logic circuits or a combination of semiconductor devices including semiconductor memories and logic circuits, the above requirement cannot be easily satisfied due to the difference in chip size.

The present invention also facilitates the stacking of semiconductor devices that are considered to be difficult to combine.

Fourth Embodiment

Figure 9:
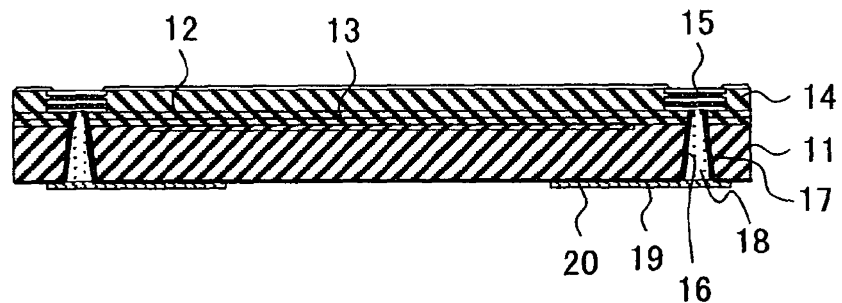
FIG. 9 illustrates a semiconductor device in accordance with a fourth embodiment of the present invention.
Figure 10:
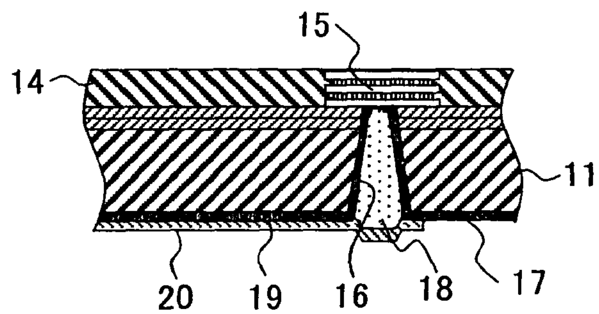
FIG. 10 is an enlarged view of the through electrode and the electrode pad shown in FIG. 9.

FIG. 9 illustrates the structure of a semiconductor device in accordance with a fourth embodiment of the present invention. FIG. 10 is an enlarged cross-sectional view of the substantial part of the semiconductor device 10A shown in FIG. 9.

In the semiconductor device 10A shown in FIG. 9, an electronic circuit unit (an integrated circuit unit) 13 that includes an active element, a passive element, and an electrode/wiring layer is formed on a principal surface 12 of a silicon semiconductor substrate 11. A wiring layer that is lead out from the electronic circuit unit 13 extends in an insulating layer 14, and is electrically connected to an electrode pad 15.

The semiconductor substrate 11 has a hole 16 formed at the location corresponding to the electrode pad 15. This hole 16 does not penetrate the electrode pad 15.

An embedded electrode 18 is provided in the hole 16 via an insulating layer 17 formed to cover the inner surface of the hole 16. One end of the embedded electrode 18 is electrically connected to the electrode pad 15 via an opening formed in the insulating layer 17 in the hole 16, and the other end of the embedded electrode 18 slightly protrudes from the other principal surface 19 of the semiconductor substrate 11.

The structure in accordance with this embodiment characteristically has a conductive layer 20 that extends from the embedded electrode 18 and is located near the protruding portion of the embedded electrode 18 on the other principal surface 19 of the semiconductor device 11. This conductive layer 20 is a laminated structure formed on the plating base (seed) layer. The laminated structure includes an aluminum (Al) surface layer, a nickel (Ni) layer, and a copper (Cu) layer.

With the conductive layer 20, the electrode area and the electrode pattern length on the bottom surface of the semiconductor device 10A are substantially increased.

Fifth Embodiment

Figure 11:
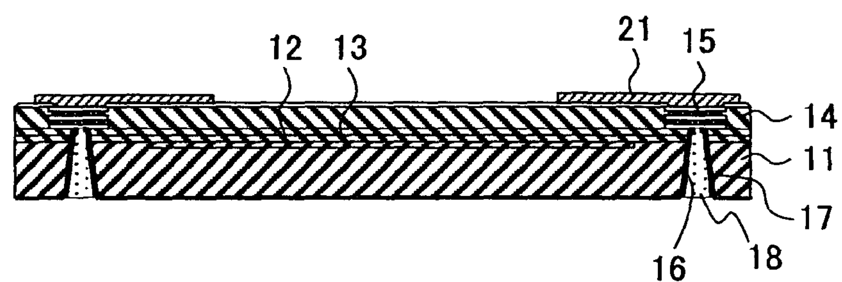
FIG. 11 illustrates a semiconductor device in accordance with a fifth embodiment of the present invention.

FIG. 11 illustrates the structure of a semiconductor device in accordance with a fifth embodiment of the present invention.

In the semiconductor device 10B shown in FIG. 11, an electronic circuit unit (an integrated circuit unit) 13 that includes an active element, a passive element, and an electrode/wiring layer is formed on a principal surface 12 of a silicon semiconductor substrate 11. A wiring layer that is lead out from the electronic circuit unit 13 extends in an insulating layer 14, and is electrically connected to an electrode pad 15.

The semiconductor substrate 11 has a hole 16 formed at the location corresponding to the electrode pad 15. This hole 16 does not penetrate the electrode pad 15.

An embedded electrode 18 is provided in the hole 16 via an insulating layer 17 formed to cover the inner surface of the hole 16. One end of the embedded electrode 18 is electrically connected to the electrode pad 15 via an opening formed in the insulating layer 17 in the hole 16, and the other end of the embedded electrode 18 slightly protrudes from the other principal surface 19 of the semiconductor substrate 11.

The structure in accordance with this embodiment characteristically has a conductive layer 21 that extends from the electrode pad 15 and is located on the upper surface of the electrode pad 15 or the upper surface on the side of the principal surface 12 of the semiconductor substrate 11. This conductive layer 20 is formed to extend toward the inside of the semiconductor device 10B. The conductive layer 21 has an aluminum layer on the insulating layer 17.

With the conductive layer 21, the electrode area and the electrode pattern length on the surface of the semiconductor device 10B are substantially increased.

Sixth Embodiment

Figure 12:
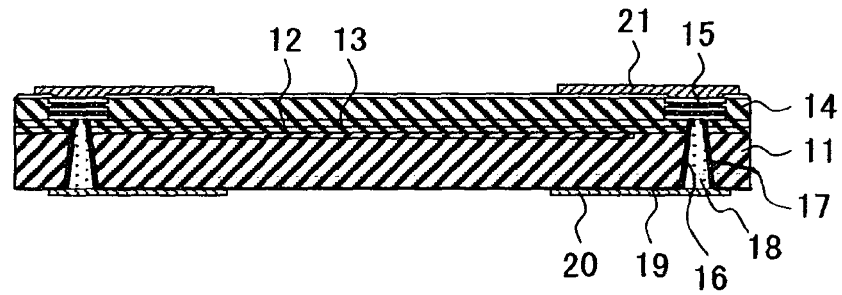
FIG. 12 illustrates a semiconductor device in accordance with a sixth embodiment of the present invention.

FIG. 12 illustrates the structure of a semiconductor device in accordance with a sixth embodiment of the present invention.

In the semiconductor device 10C shown in FIG. 12, an electronic circuit unit (an integrated circuit unit) 13 that includes an active element, a passive element, and an electrode/wiring layer is formed on a principal surface 12 of a silicon semiconductor substrate 11. A wiring layer that is lead out from the electronic circuit unit 13 extends in an insulating layer 14, and is electrically connected to an electrode pad 15.

The semiconductor substrate 11 has a hole 16 formed at the location corresponding to the electrode pad 15. This hole 16 does not penetrate the electrode pad 15.

An embedded electrode 18 is provided in the hole 16 via an insulating layer 17 formed to cover the inner surface of the hole 16. One end of the embedded electrode 18 is electrically connected to the electrode pad 15 via an opening formed in the insulating layer 17 in the hole 16, and the other end of the embedded electrode 18 slightly protrudes from the other principal surface 19 of the semiconductor substrate 11.

The structure in accordance with this embodiment characteristically has a conductive layer 21 that extends from the electrode pad 15 and is located on the upper surface of the electrode pad 15 or the upper surface on the side of the principal surface 12 of the semiconductor substrate 11.

Also, the structure in accordance with this embodiment characteristically has a conductive layer 20 that extends from the embedded electrode 18 and is located near the protruding portion of the embedded electrode 18 on the other principal surface 19 of the semiconductor substrate 11.

These conductive layers 20 and 21 extend toward the inside of the semiconductor device 10C.

With the conductive layers 20 and 21, the electrode area and the electrode pattern length on the upper and bottom surfaces of the semiconductor device 10C are substantially increased.

Figure 13:
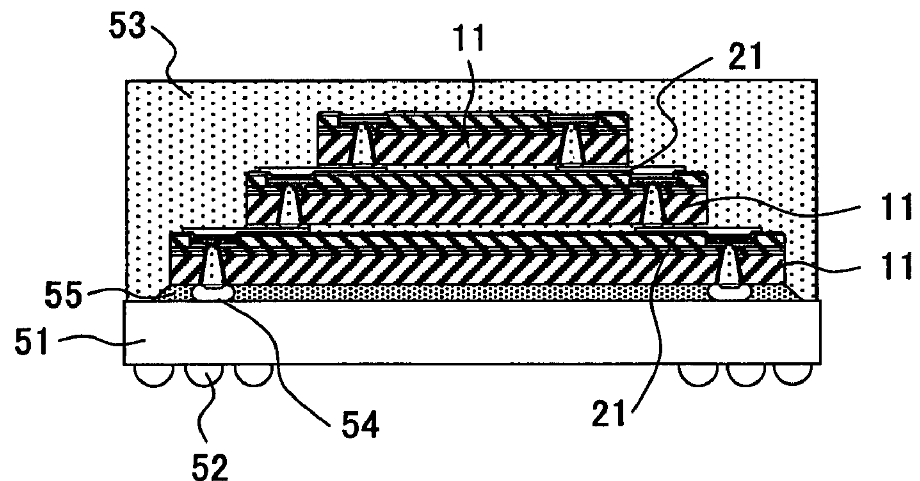
FIG. 13 illustrates another example of a three-dimensional semiconductor device.
Figure 14:
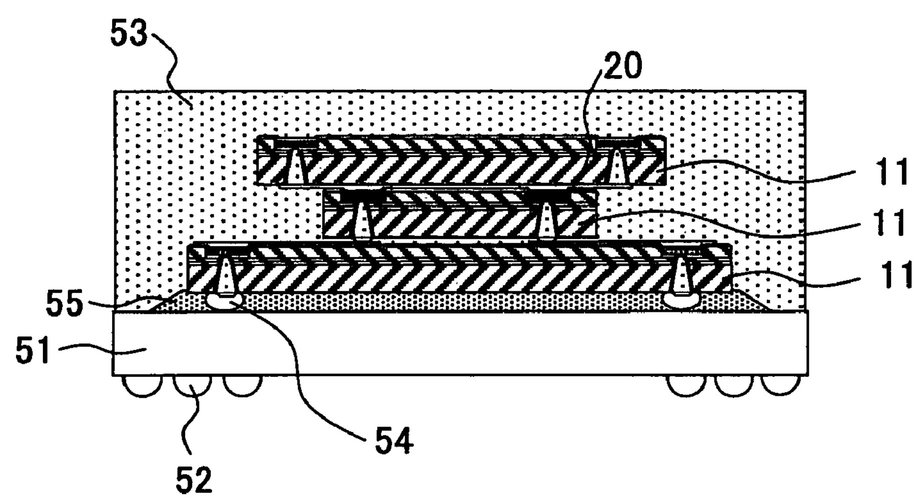
FIG. 14 illustrates yet another example of a three-dimensional semiconductor device.

As the electrode area and the electrode pattern length are substantially increased in each of the semiconductor devices of the fourth through sixth embodiments, semiconductor devices having different chip sizes can be stacked on one another as shown in FIGS. 13 and 14.

Accordingly, semiconductor chips having different functions can be easily combined, and high performance semiconductor devices can be realized.

For example, it is easy to combine semiconductor devices having different chip sizes, different operating conditions, and different functions. More specifically, it is easy to combine flash memory devices and static memory devices, or combine a microcomputer and memory devices.

Figure 15:
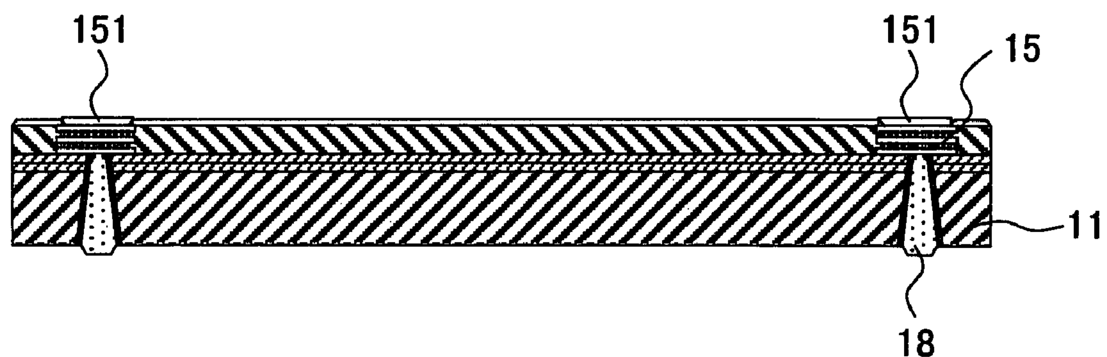
FIG. 15 illustrates another example of a semiconductor device.

In the foregoing embodiments, the electrode pad of a first semiconductor device is in contact with the embedded electrode of a second semiconductor device. However, so as to improve the connectivity, it is also possible to employ a plating layer 151 on the surface of each electrode pad 15, as shown in FIG. 15.

Figure 16:
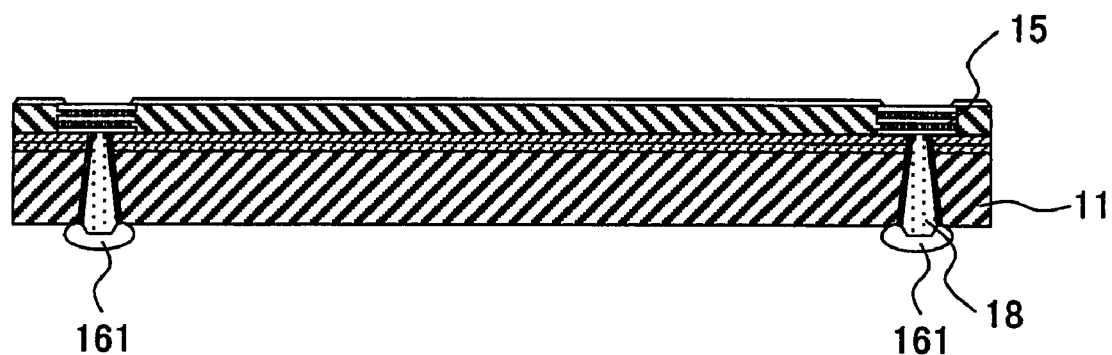
FIG. 16 illustrates yet another example of a semiconductor device.

In the foregoing embodiments, a plating layer is formed on the surface of the protruding portion of the embedded electrode. However, as shown in FIG. 16, the connectivity can be improved by providing soldering cover layers 161 in the form of solder balls or the like.

Meanwhile, in the structure and the manufacturing method in accordance with the first embodiment, the hole that penetrates the insulating layer on one of the principal surfaces of the semiconductor substrate is filled with metal to form the embedded electrode. In accordance with the present invention, it is also possible to provide a metal layer 171 to cover the insulating layer selectively formed in the hole as shown in FIG. 8A, the exposed portion of the electrode pad, and the bottom surface of the semiconductor substrate. Thus, an embedded electrode can be formed. Reference numeral 171*a* indicates a metal layer formed on the side wall of the hole 16, and reference numeral 171*b* indicates a metal layer formed on the principal surface 19 of the silicon semiconductor substrate 11. The metal layers can be formed by a sputtering technique or the like. The metal layer 171 forms the "lead-out part" claimed in claims.

As described above, the through hole 16 has a tapered structure. Accordingly, the film formed by the sputtering technique can have a uniform thickness.

Using the sputtering technique, a conductive layer can be more readily formed. Accordingly, the period of time required for manufacturing the semiconductor device can be shortened.

Figure 17:
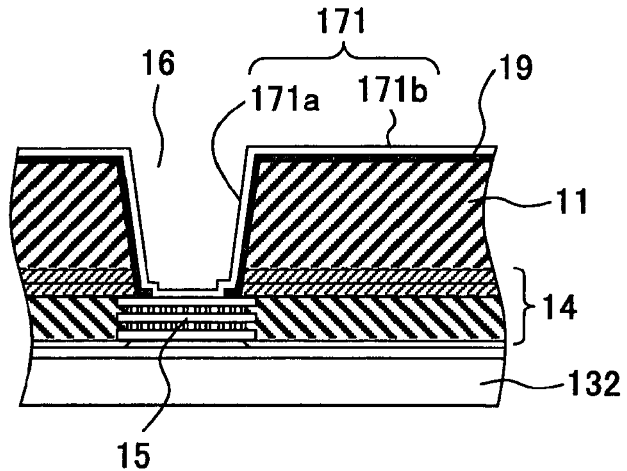
FIG. 17 is an enlarged view of a first modification of the lead-out part.

FIG. 17 is an enlarged view of this structure.

Figure 20:
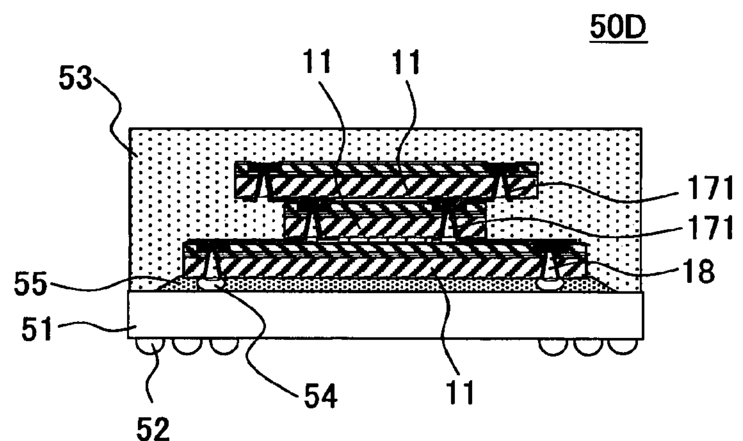
FIG. 20 illustrates another example of a three-dimensional semiconductor device.

FIG. 20 illustrates a structure in which semiconductor devices each having a metal layer to form an embedded electrode layer, instead of the embedded electrode structure formed by filling the hole with metal, are stacked on one another.

In FIG. 20, the lower most semiconductor device 10-1 that is connected to the supporting substrate has an embedded electrode formed with a metal filling, but semiconductor devices 10-2 and 10-3 placed on the semiconductor device 10-1 each have an embedded electrode 171 formed by laminating a metal layer.

In accordance with the present invention, in the situation where an insulating layer is selectively formed in the hole as shown in FIG. 8A, a gold (Au) wire may be connected to the exposed portion of the electrode pad.

The gold wire is lead out, and the lead-out portion is melted down to form a so-called stud bump 181. The stud bump 181 forms the "lead-out part" claimed in claims.

A wire bonding technique normally used for semiconductor devices is applied to the stud bump structure, so that the stud bump structure can be easily achieved at low costs using a wire bonding device.

Figure 18:
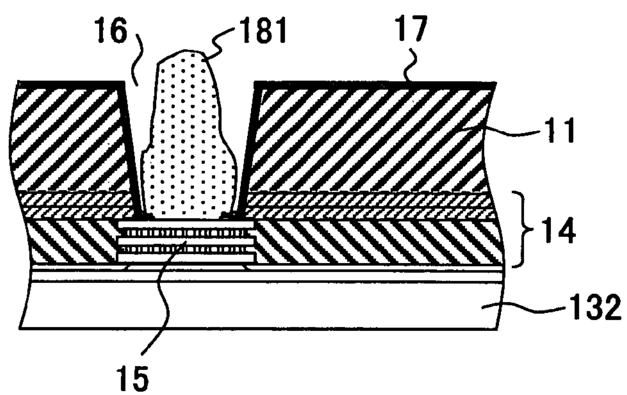
FIG. 18 is an enlarged view of a second modification of the lead-out part.

FIG. 18 is an enlarged view of this structure.

Figure 21:
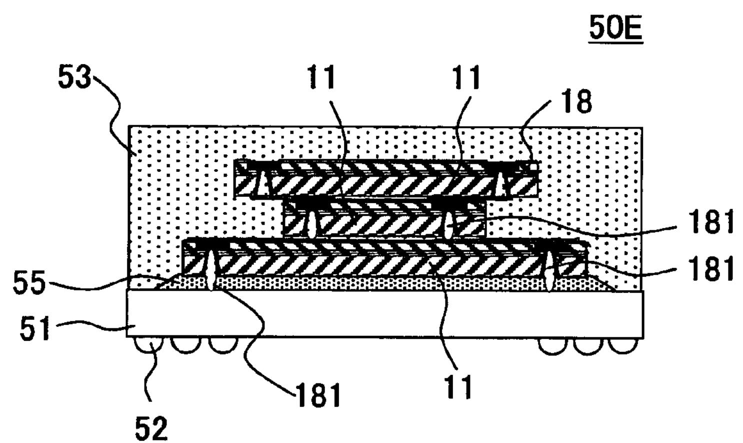
FIG. 21 illustrates yet another example of a three-dimensional semiconductor device.

FIG. 21 illustrates a structure in which semiconductor devices each having an embedded electrode structure formed with a stud bump structure, instead of an embedded electrode structure formed with a metal filling, are stacked on one another.

In FIG. 21, an embedded electrode 181 formed with a stud bump structure is employed in each of the semiconductor devices 10-1 and 10-2 that are connected to the supporting substrate.

Also in accordance with the present invention, where an insulating film is selectively formed in the hole as shown in FIG. 8A, the hole may be filled with conductive paste 191, instead of the metal filling. The conductive paste 191 forms the "lead-out part" claimed in claims.

This embedded electrode structure formed by filling the hole with the conductive paste 191 can be provided at lower costs than an embedded electrode structure formed with a metal filling.

Figure 19:
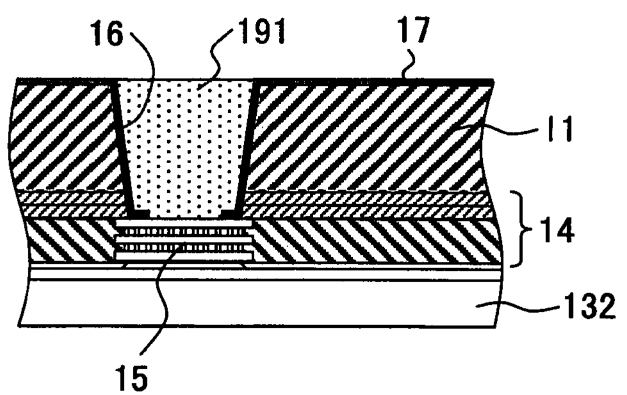
FIG. 19 is an enlarged view of a third modification of the lead-out part.

FIG. 19 is an enlarged view of this structure.

Figure 22:
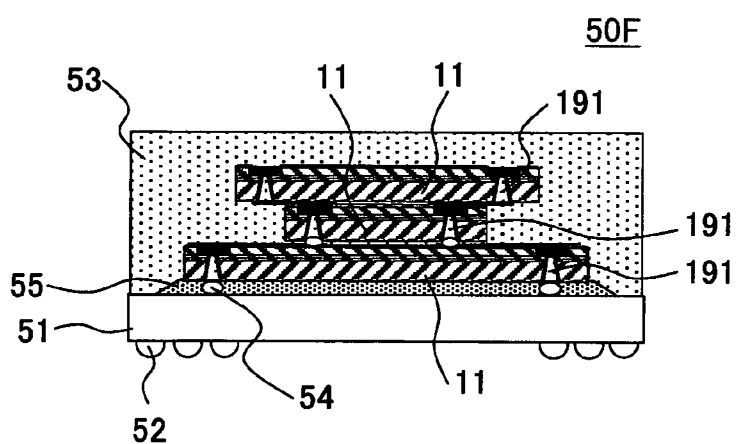
FIG. 22 illustrates still another example of a three-dimensional semiconductor device.

FIG. 22 illustrates a structure in which semiconductor devices each having an embedded electrode structure formed with the conductive paste filling, instead of the embedded electrode structure formed with the metal filling, are stacked on one another.

In FIG. 22, an embedded electrode 191 formed with the conductive paste filling is employed in each of the semiconductor devices 10-1, 10-2, and 10-3 that are connected to the supporting substrate.

If there are variations in chip size in any of the structures shown in FIGS. 20 through 22, the electrode area or the electrode pattern length is increased in the manner shown in FIG. 12, if necessary.

Further, in this embodiment, the supporting substrate is fixed to a principal substrate of the semiconductor device with double-face tape. However, it is also possible to form a base metal layer using a plating technique or a sputtering technique, and provide a supporting substrate on the base metal layer via an adhesive material. Here, the supporting substrate is a metal plate made of copper (Cu) or the like.

Figure 23A:
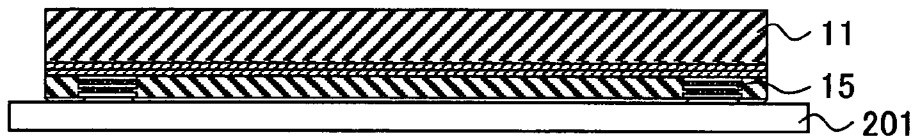
FIGS. 23A through 23C illustrate a modification of the structure that supports a silicon wafer.
Figure 23B:
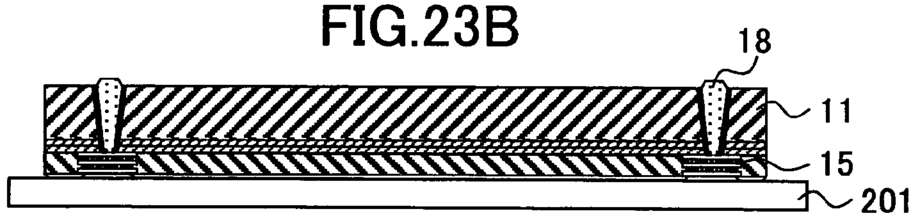
Figure 23C:
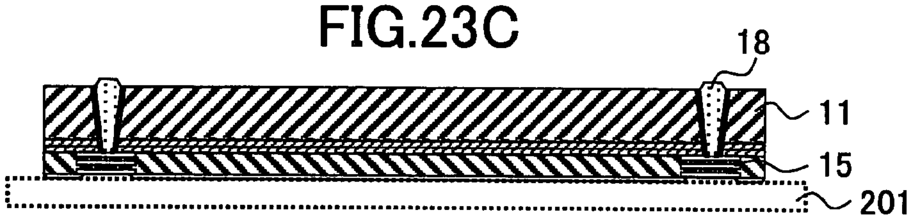

More specifically, as shown in FIG. 23A, a supporting substrate 201 made of copper (Cu) is fixed to a principal surface of the semiconductor substrate 11. As shown in FIG. 23B, the embedded electrode 18 is then formed, with the supporting substrate 201 serving as an electrode in the formation of the embedded electrode 18. As shown in FIG. 23C, the supporting substrate 201 is melted and removed.

The supporting substrate 201 made of copper (Cu) is bonded to the semiconductor substrate 11 in the following manner.

Figure 24A:
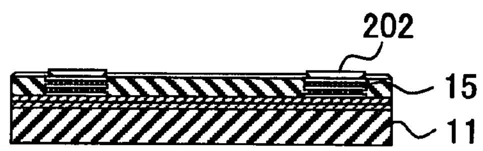
FIGS. 24A through 24C illustrate the adhesion of a supporting plate member made of Cu to the silicon wafer.

As shown in FIG. 24A, a plating layer 202 that includes a gold (Au) surface layer and a nickel (Ni) base layer is formed through electroless plating on the electrode pad 15 exposed through a principal surface of the semiconductor substrate 11.

Figure 24B:
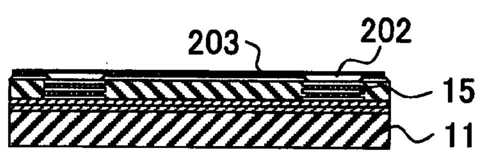

As shown in FIG. 24B, a base layer 203 that is made of nickel (Ni) or titanium (Ti) is formed to cover the plating layer 202 on the electrode pad 15 and the insulating layer around the electrode pad 15.

Figure 24C:
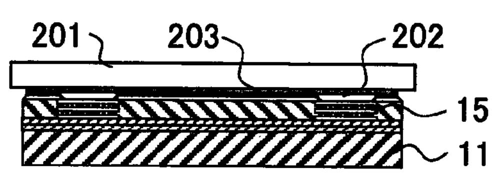

As shown in FIG. 24C, an organic adhesive such as Cerasin (manufactured by Mitsubishi Gas Chemical Co., Inc.) or a polyimide-based heat resistant adhesive is applied onto the base layer 203, so that the supporting substrate 201 made of copper (Cu) with the same size as the semiconductor substrate 11 is bonded and fixed onto the base layer 203.

After the through hole is formed, the copper of the supporting substrate is removed using an acid etching liquid, and the adhesive layer is removed with an alkali etching liquid.

To facilitate the stacking of semiconductor devices (semiconductor chips), a conductive passage that penetrates the semiconductor substrate from one principal surface to the other is provided in accordance with the present invention. The conductive passage characteristically penetrates the insulating layer formed on the semiconductor substrate, but does not penetrate the corresponding electrode pad. The hole (the conductive passage) is then filled with a conductive material or a conductive layer is formed, so as to realize an embedded conductive layer that penetrates the semiconductor substrate.

The lead-out structure having such an embedded conductive layer does not penetrates the electrode pad, unlike the equivalent structure of the prior art. Accordingly, a stacked structure can be realized with high reliability, without a decrease in electrical or mechanical connectivity to the electrode pad.

Seventh Embodiment

Next, a memory three-dimensional semiconductor device in accordance with a seventh embodiment of the present invention is described.

FIGS. 25 through 30B illustrate the memory three-dimensional semiconductor device 50M in accordance with the seventh embodiment.

The memory three-dimensional semiconductor device 50M has four memory semiconductor devices 10M-1 through 10M-4 electrically connected to one another and stacked on one another, as shown in FIGS. 25, 26, 27B, 28B, 29B, and 30B. A memory integrated circuit is formed in each of the memory semiconductor devices 10M-1 through 10M-4. A memory semiconductor device designating unit 290 that designates a memory semiconductor device to perform data read and write operations among the memory semiconductor devices 10M-1 through 10M-4 is provided on a side surface.

The memory semiconductor device designating unit 290 includes select electrode pads 209 (see FIGS. 27A and 27B) and select terminals 210-1 through 210-4 that are provided in each of the memory semiconductor devices 10M-1 through 10M-4; comb-like wires 211-1 through 211-4 and electrode pad structures 221 through 224, 231 through 234, 241 through 244, and 251 through 254 that are provided in association with the select terminals 210-1 through 210-4 of the respective memory semiconductor devices 10M-1 through 10M-4; and external select bump terminals 260-1 through 260-4 provided on the lower surface of an interposer 51M.

Where wires 271 through 274 are formed as described later, the memory semiconductor device designating unit 290 is formed with the wires 271 through 274 and the wires 211-1 through 211-4 having the "X"-denoted portions cut off.

Figure 26:
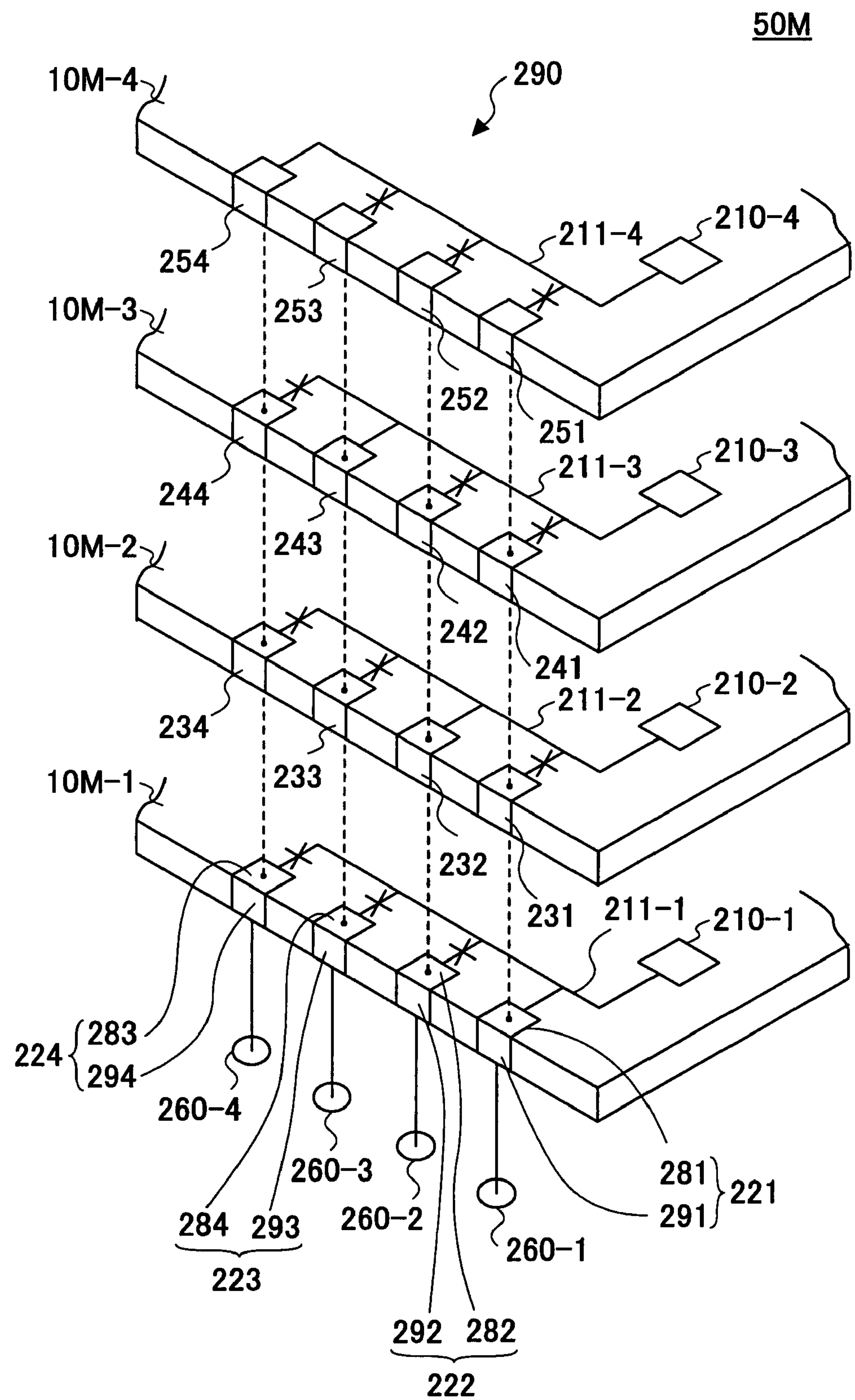
FIG. 26 is an exploded perspective view of the memory three-dimensional semiconductor device of FIG. 25.
Figure 27A:
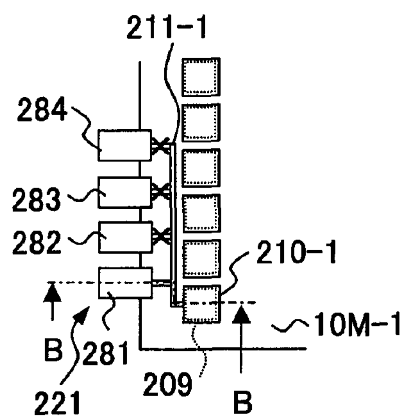
FIG. 27A is a plan view illustrating the situation in which the wires of the lowermost memory semiconductor device are cut off.
Figure 27B:
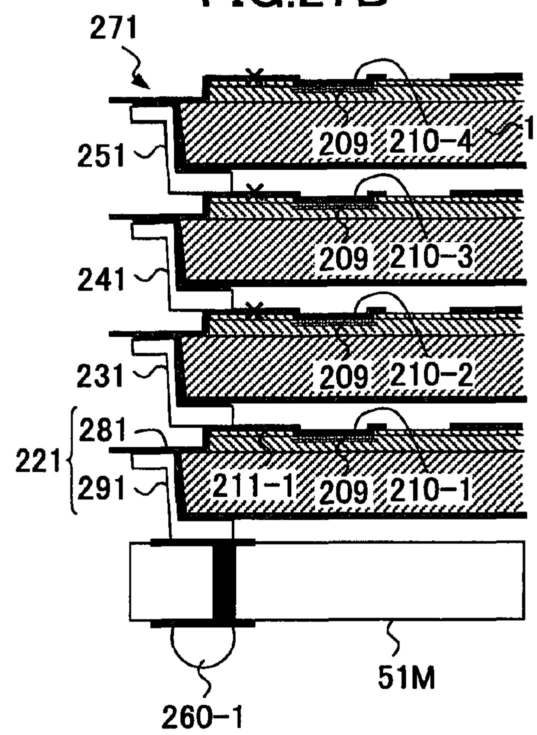
FIG. 27B is a cross-sectional view of the memory three-dimensional semiconductor device, taken along the line XXVII-XXVII of FIG. 25.

The electrode pad structure 221 has a first electrode part 281 and a second electrode part 291 connected to each other on a side surface of the corresponding semiconductor chip, as shown in FIGS. 26, 27A, and 27B. The first electrode part 281 is formed on the surface of the memory semiconductor chip, and the second electrode part 291 extends from the side surface to the bottom surface of the memory semiconductor chip.

The electrode pad structures 231, 241, and 251 each have the same structure as the electrode pad structure 221.

Figure 28A:
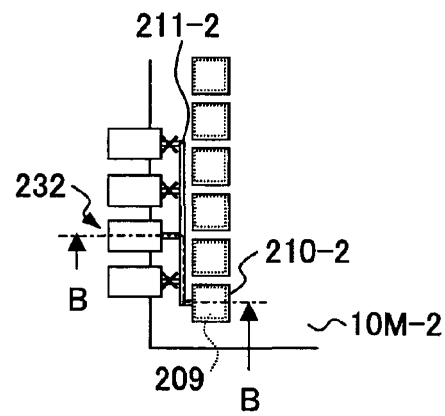
FIG. 28A is a plan view illustrating the situation in which the wires of the second lowermost memory semiconductor device are cut off.
Figure 28B:
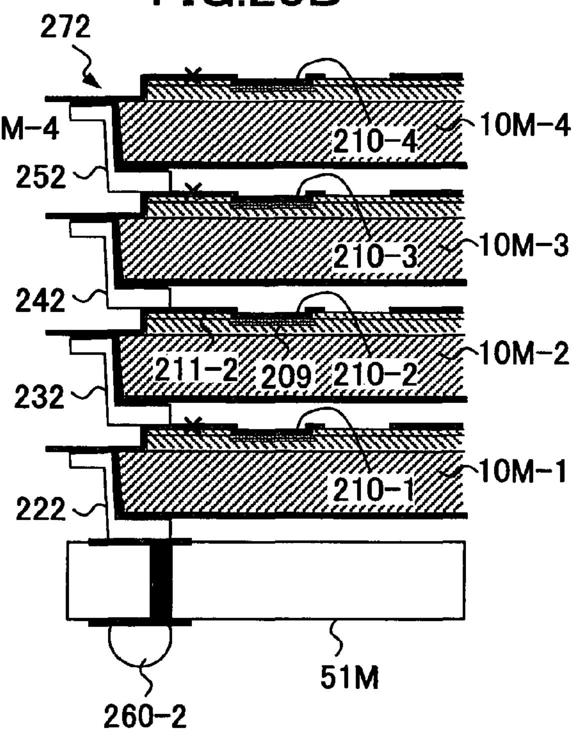
FIG. 28B is a cross-sectional view of the memory three-dimensional semiconductor device, taken along the line XXVIII-XXVIII of FIG. 25.

As shown in FIGS. 28A and 28B, the electrode pad structures 222, 232, 242, and 252 each have the same structure as the electrode pad structure 221.

Figure 29A:
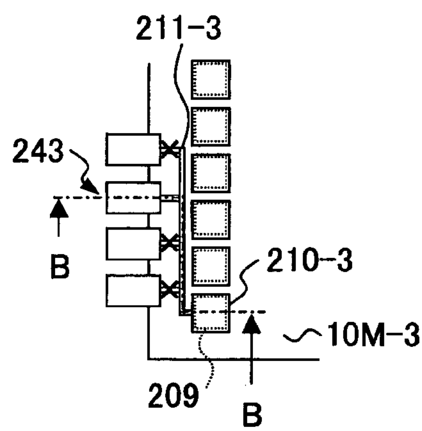
FIG. 29A is a plan view illustrating the situation in which the wires of the second uppermost memory semiconductor device are cut off.
Figure 30A:
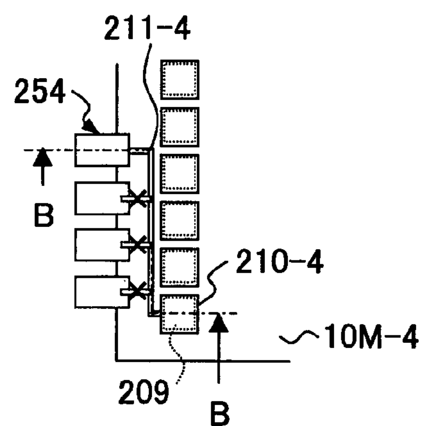
FIG. 30A is a plan view illustrating the situation in which the wires of the uppermost memory semiconductor device are cut off.
Figure 29B:
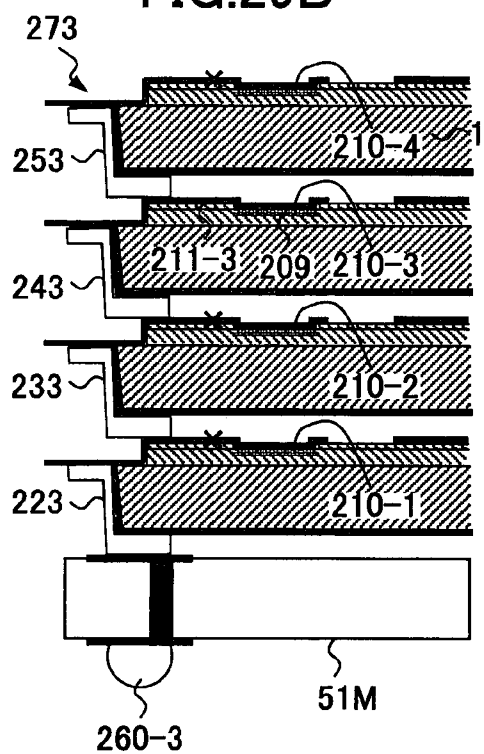
FIG. 29B is a cross-sectional view of the memory three-dimensional semiconductor device, taken along the line XXIX-XXIX of FIG. 25.
Figure 30B:
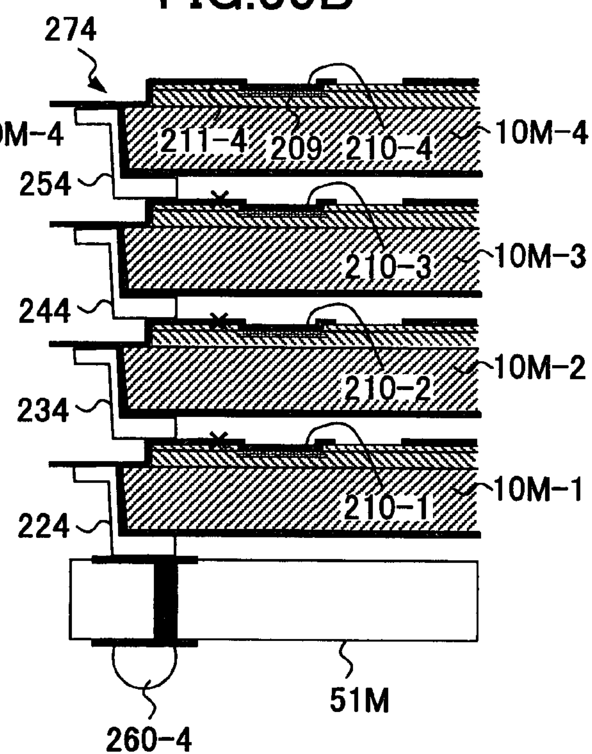
FIG. 30B is a cross-sectional view of the memory three-dimensional semiconductor device, taken along the line XXX-XXX of FIG. 25.

As shown in FIGS. 29A and 29B, the electrode pad structures 223, 233, 243, and 253 each have the same structure as the electrode pad structure 221. As shown in FIGS. 30A and 30B, the electrode pad structures 224, 234, 244, and 254 each have the same structure as the electrode pad structure 221.

As shown in FIG. 26, the electrode pad structures 221 through 224, 231 through 234, 241 through 244, and 251 through 254 are located at the respective ends of the wires 211-1 through 211-4, and are also located at the corresponding areas on the side surfaces of the semiconductor chips of the memory semiconductor devices 10M-1 through 10M-4. These electrode pad structures each extend from the side surface to the upper surface and the lower surface of the corresponding semiconductor chip.

The wires 211-1 through 211-4 each have the "X"-denoted portions cut off with a laser, as shown in FIGS. 26, 27A, 27B, 28A, 28B, 29A, 29B, 30A, and 30B.

The electrode pad structures 221 through 224 of the lowermost memory semiconductor device 10M-1 are electrically connected to the external select bump terminals 260-1 through 260-4 on the interposer 51M, respectively.

The electrode pad structures 221 through 224, 231 through 234, 241 through 244, and 251 through 254 are electrically connected to one another through the corresponding side-surface electrode units and bottom-surface electrode units. More specifically, the electrode pad structures 221, 231, 241, and 251 are electrically connected to one another. The electrode pad structures 222, 232, 242, and 252 are electrically connected to one another. The electrode pad structures 223, 233, 243, and 253 are electrically connected to one another. The electrode pad structures 224, 234, 244, and 254 are electrically connected to one another.

Figure 25:
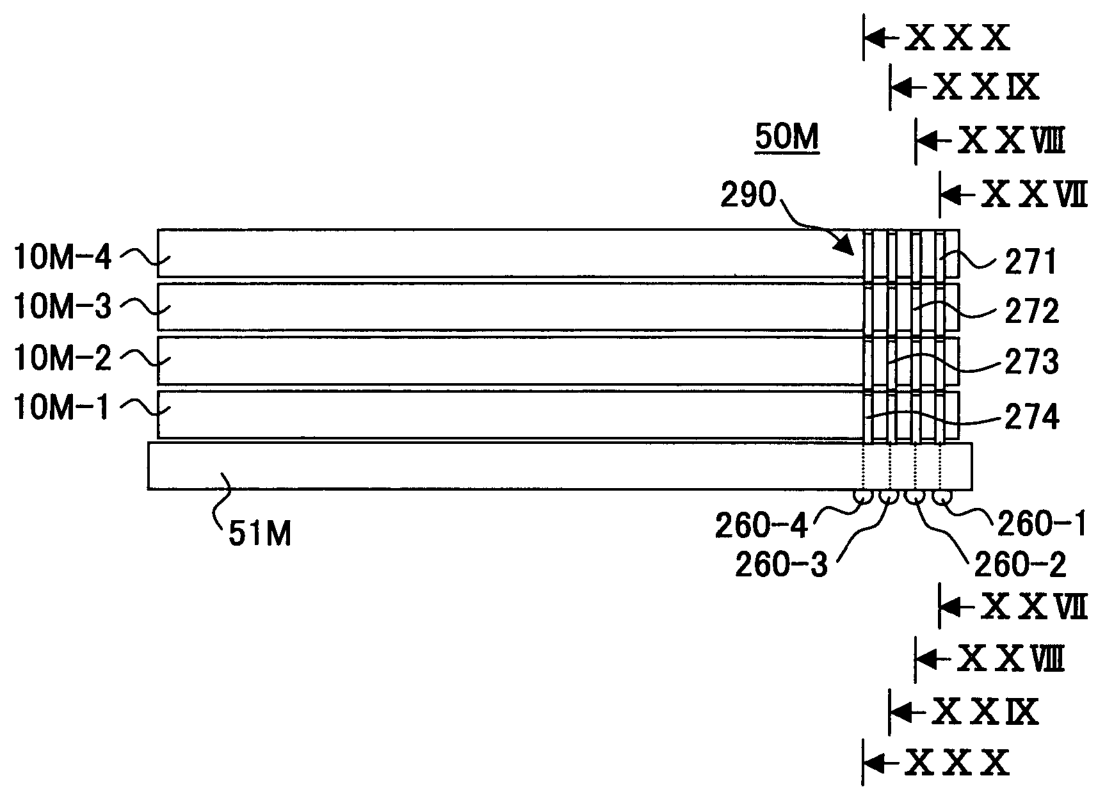
FIG. 25 illustrates a memory three-dimensional semiconductor device in accordance with a seventh embodiment of the present invention.

When the memory three-dimensional semiconductor device 50M is seen from a side, the electrode pad structures 221 through 224, 231 through 234, 241 through 244, and 251 through 254 form four wires 271 through 274 that extend horizontally on the side surface of the memory three-dimensional semiconductor device 50M, as shown in FIG. 25.

Since the wires 211-1 through 211-4 have the "X"-denoted portions cut off, a select signal supplied to the external select bump terminal 260-1 is sent only to the select terminal 210-1, a select signal supplied to the external select bump terminal 260-2 is sent only to the select terminal 210-2, a select signal supplied to the external select bump terminal 260-3 is sent only to the select terminal 210-3, and a select signal supplied to the external select bump terminal 260-4 is sent only to the select terminal 210-4. With the select signal, a memory semiconductor device to perform data read and write operations is designated among the four memory semiconductor devices 10M-1 through 10M-4.

As the above described memory semiconductor device designating unit 290 is formed to utilize a side surface of the memory three-dimensional semiconductor device 50M, a smaller memory semiconductor device can be obtained, compared with a case where a memory semiconductor device designating unit is formed by placing terminals and wires on an interposer or the like on which memory integrated circuits are mounted. Thus, the above described memory three-dimensional semiconductor device 50M is smaller in size on a plane and more compact than a conventional memory three-dimensional semiconductor device.

As shown in FIGS. 31 through 43, the above described memory semiconductor device designating unit 290, together with each memory integrated circuit, is formed on the semiconductor substrate. Therefore, the process for forming the memory semiconductor device designating unit 290 is not necessary after the chip-type memory semiconductor devices are stacked on one another, and the memory three-dimensional semiconductor device 50M can be completed by simply stacking the chip-type memory semiconductor devices on one another. Thus, the memory three-dimensional semiconductor device 50M can be manufactured with high productivity.

Next, the method of producing the memory semiconductor device 10M-1, especially the electrode pad structure 221 and the wire 211-1, is described.

Figure 31:
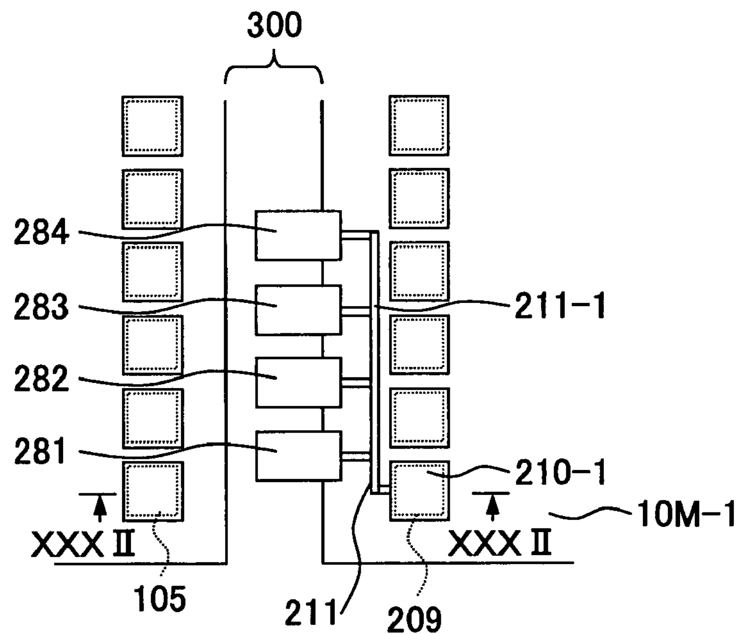
FIG. 31 illustrates the situation when the first manufacturing step of performing rewiring on the lowermost memory semiconductor device to form the electrode pad structures and wires is completed.
Figure 32:
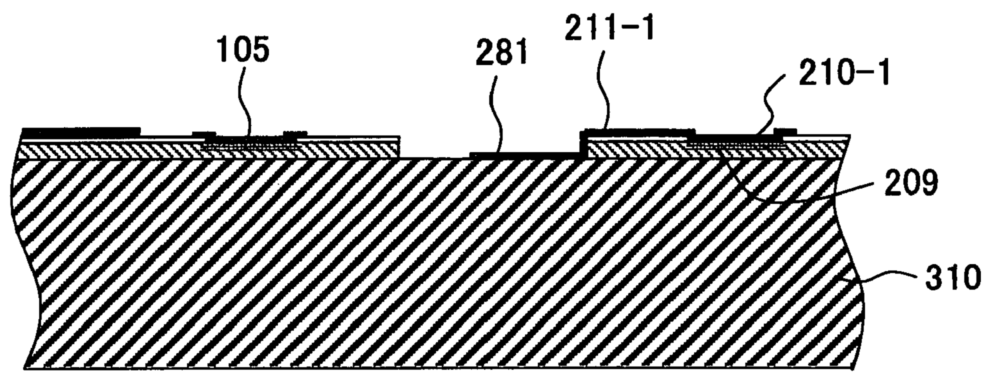
FIG. 32 is a cross-sectional view of the memory semiconductor device, taken along the line XXXII-XXXII of FIG. 31.

First, as shown in FIGS. 31 and 32, rewiring is performed on a silicon wafer 310 that has memory integrated circuits and a select electrode pad 209 formed therein, so as to form the select terminal 210-1 on the select electrode pad 209, the wire 211-1 that extends from the select terminal 210-1 and has a pattern width of 50 μm or smaller, and the first electrode parts 281 through 284 at the ends of the wire 211-1. A half of each of the first electrode parts 281 through 284 is located on a scribe line 300 that divides the silicon semiconductor substrate into semiconductor chips.

Figure 33:
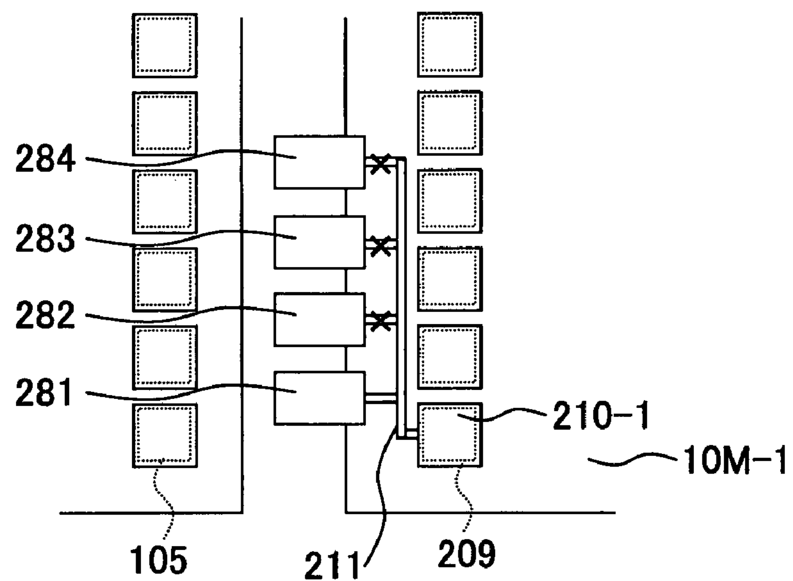
FIG. 33 illustrates the situation in which the wires are cut off.

As shown in FIG. 33, the wire 211-1 is cut off at the portions denoted by "X", using a laser with a spot diameter of 100 μm. By doing so, the electric connection between the select terminal 210-1 and each of the first electrode parts 282 through 284 is cut off, and only the first electrode part 281 remains electrically connected to the select terminal 210-1.

Figure 34:
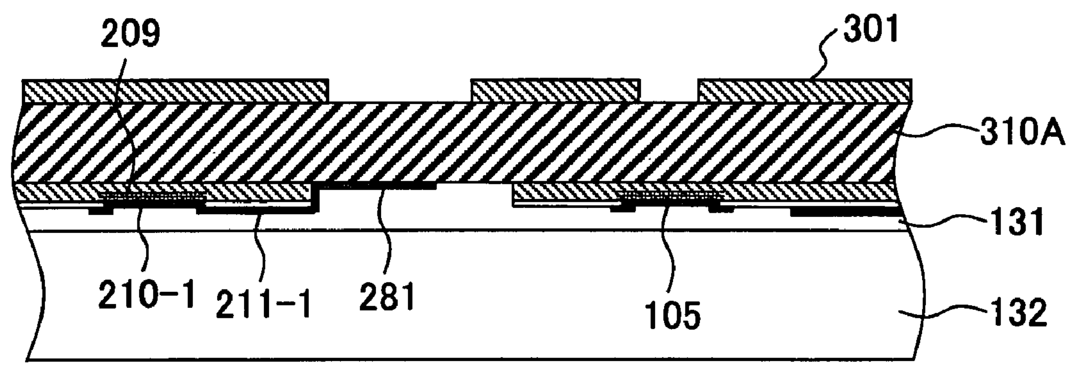
FIG. 34 illustrates the situation in which the bottom surface of the silicon wafer is ground and thinned.

As shown in FIG. 34, with the memory integrated circuit side of the semiconductor substrate 310 facing down, the semiconductor substrate 310 is bonded onto the plate-like supporting member (supporting substrate) 132 with the double-faced tape 131. The bottom surface of the semiconductor substrate 310 is then ground, so as to thin the semiconductor substrate 310.

Figure 35:
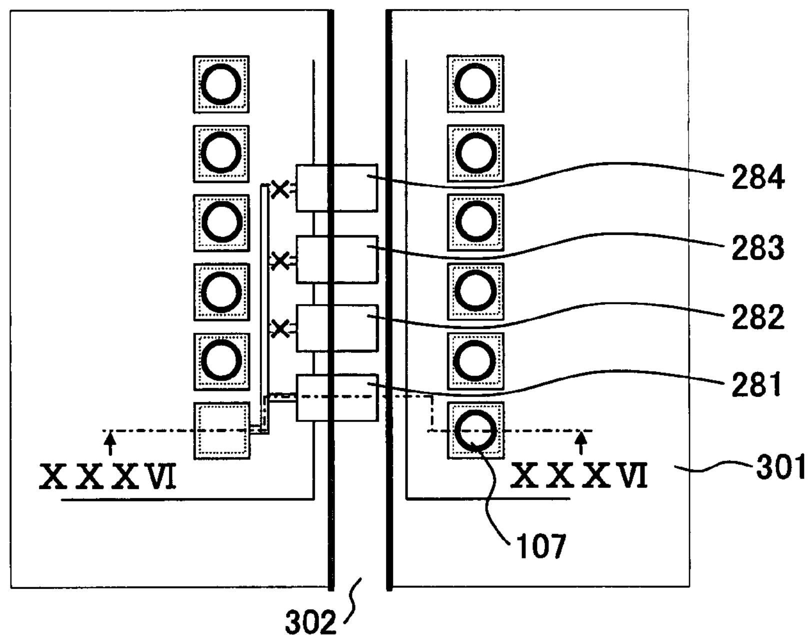
FIG. 35 is a plan view of the memory semiconductor device after an etching process.
Figure 36:
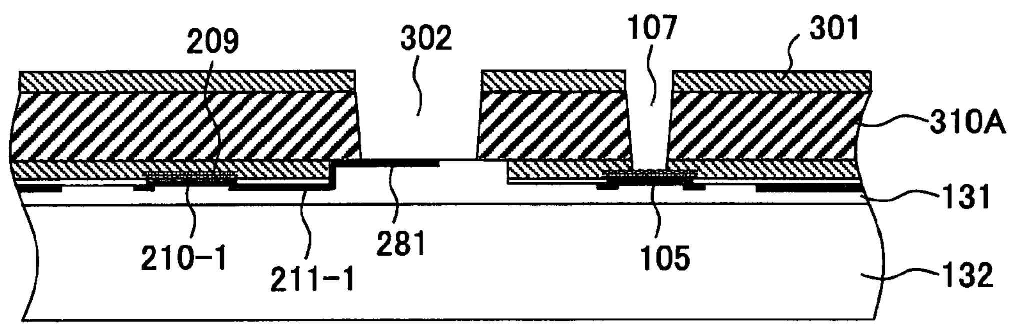
FIG. 36 is a cross-sectional view of the memory semiconductor device, taken along the line XXXVI-XXXVI of FIG. 35.

Next, a predetermined resist pattern 301 is formed on the bottom surface of the thinned semiconductor substrate 310A. Etching is then performed to form the hole 107 and a scribe groove 302 in the scribe line 300, as shown in FIGS. 35 and 36. The end half of each of the first electrode parts 281 through 284 is exposed through the bottom surface of the scribe groove 302.

Figure 37:
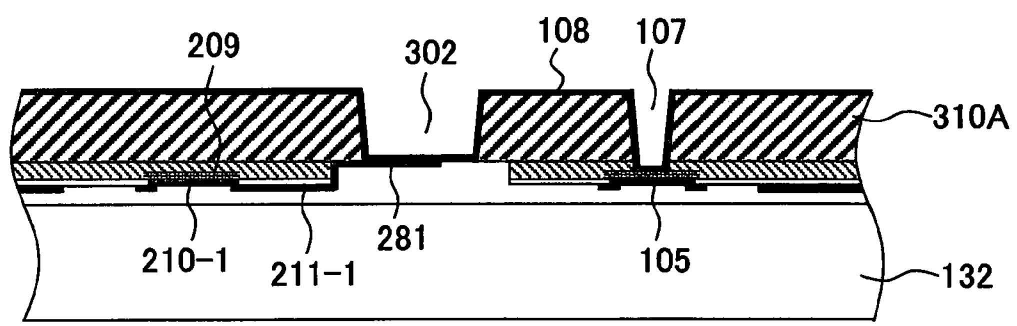
FIG. 37 is a plan view of the memory semiconductor device that has an insulating film formed thereon.

After the resist pattern 301 is removed, the insulating film 108 is formed on the bottom surface of the semiconductor substrate 310A, as shown in FIG. 37.

Figure 38:
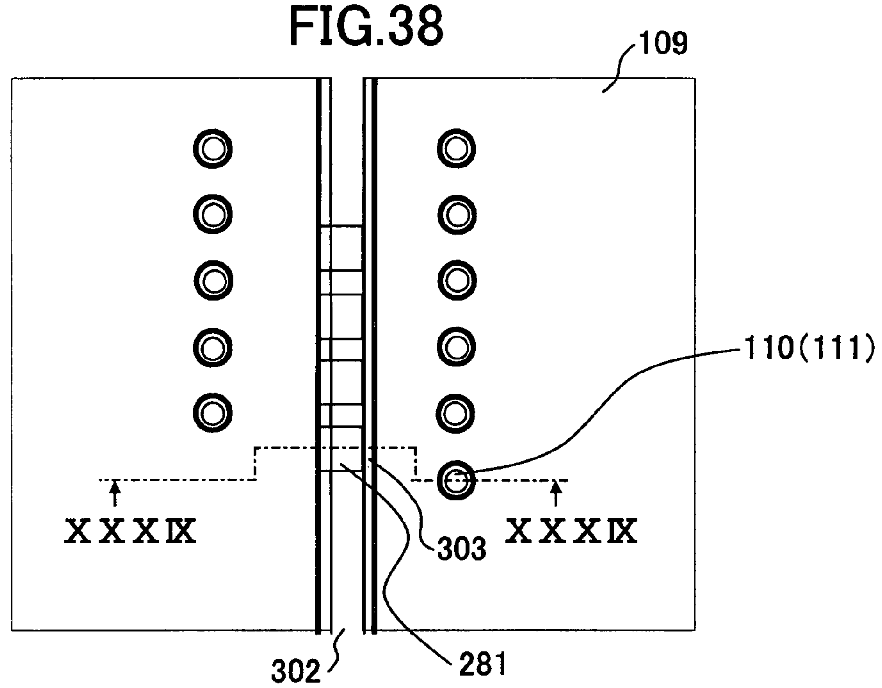
FIG. 38 is a plan view of the memory semiconductor device that has a slit formed in the insulating film.
Figure 39:
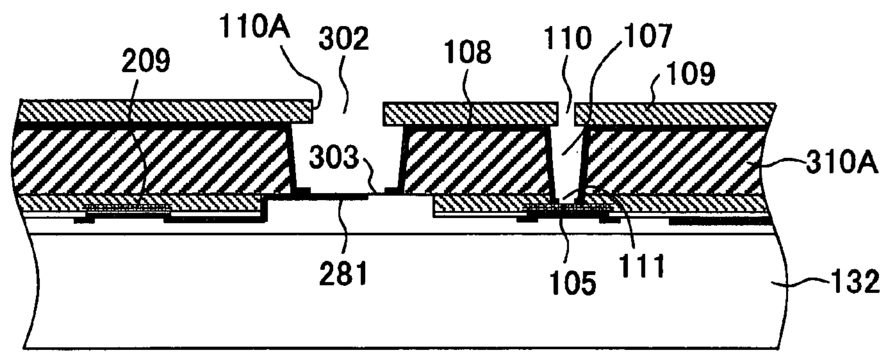
FIG. 39 is a cross-sectional view of the memory semiconductor device, taken along the line XXXIX-XXXIX of FIG. 38.

As shown in FIGS. 38 and 39, the dry film 109 is bonded onto the bottom surface of the semiconductor substrate 310A, and a slit 110A and a pin hole 110 are formed in the dry film 109. With the dry film 109 serving as a mask, dry etching is performed to selectively remove an insulating film 45. A slit 303 is formed in the bottom of the scribe groove 302, and the opening 111 is also formed in the bottom of the hole 107.

Figure 40:
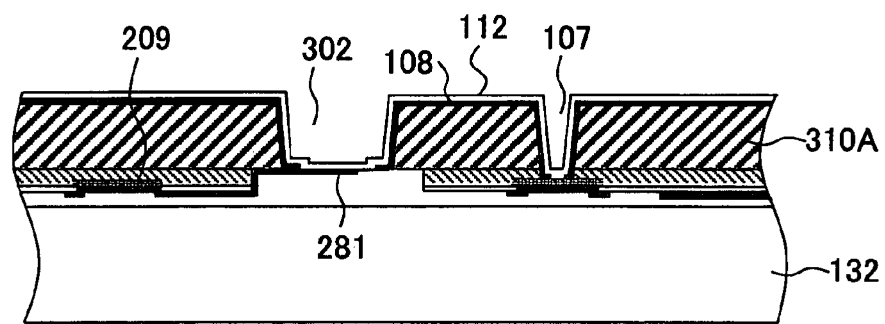
FIG. 40 is a cross-sectional view of the memory semiconductor device having a seed metal layer formed thereon.

Next, the seed metal layer 112 is formed on the insulating film 108, as shown in FIG. 40.

Figure 41:
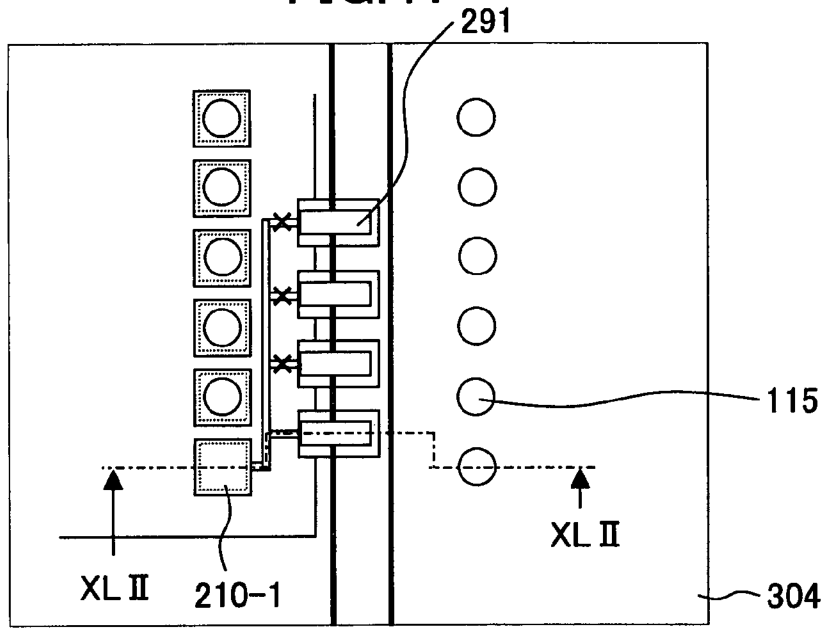
FIG. 41 is a plan view of the memory semiconductor device having second electrode parts and through electrode parts formed therein.
Figure 42:
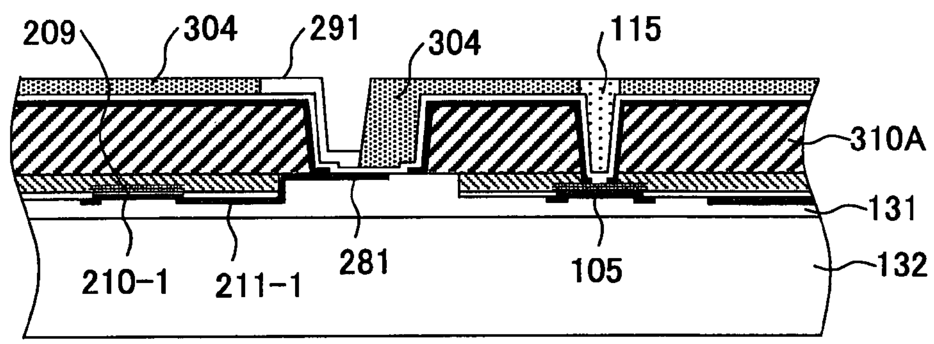
FIG. 42 is a cross-sectional view of the memory semiconductor device, taken along the line XLII-XLII of FIG. 41.

As shown in FIGS. 41 and 42, after a plating resist layer 304 is selectively formed, the semiconductor substrate 310A is immersed in a Cu plating bath, and electroplating is performed. Although there are steps on the bottom surface of the semiconductor substrate 310A, a resist with high solubility is employed, and exposure is carried out by a stepper exposure device with a small numerical aperture (NA). Thus, the plating resist 304 can be suitably formed. Through electroplating, the second electrode parts 291 through 294 are formed in the scribe groove 302, and the embedded electrode 115 is formed in the hole 107.

As shown in FIG. 42, the second electrode part 291 is electrically connected to the first electrode part 281, and is formed on the side surface of the semiconductor substrate 310A and extends along the bottom surface of the semiconductor substrate 310A.

Meanwhile, the second electrode part 292 is electrically connected to the first electrode part 282, the second electrode part 293 is electrically connected to the first electrode part 283, and the second electrode part 294 is electrically connected to the first electrode part 284. These electrode parts 292, 293, and 294 are formed on the side surface of the semiconductor substrate 310A and extend along the bottom surface of the semiconductor substrate 310A.

Figure 43:
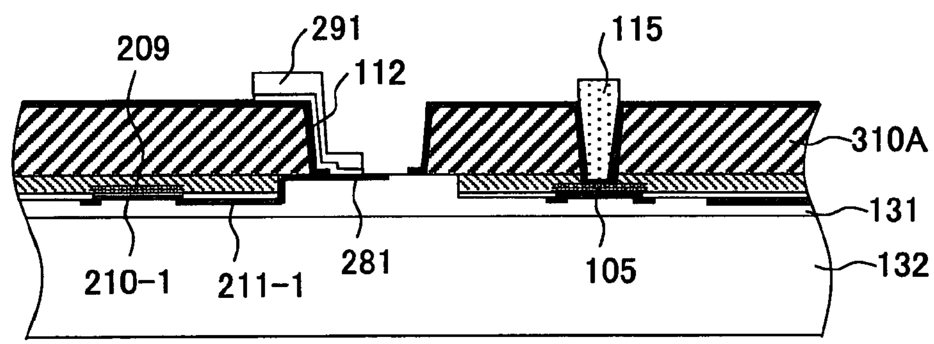
FIG. 43 is a cross-sectional view of the memory semiconductor device from which the plating resist has been removed.

Next, as shown in FIG. 43, the plating resist 304 is removed, and the exposed portions of the seed metal layer 112 are removed.

After that, the adhesiveness of the double-faced tape 131 is reduced, and the plate-like supporting member 132 is removed. As a result, the memory semiconductor device 10M-1 shown in FIGS. 25 and 26 is obtained.

The other memory semiconductor devices 10M-2, 10M-3, and 10M-4 are produced through the same procedures as the above, except that the wires 211-2 through 211-4 are cut off at different locations.

As described above, the stacking order of the memory semiconductor devices 10M-1 through 10M-4 is determined in advance during the wafer processing.

The memory three-dimensional semiconductor device 50M is manufactured by picking up the memory semiconductor device 10M-1 from a first semiconductor substrate, the memory semiconductor device 10M-2 from a second semiconductor substrate, the memory semiconductor device 10M-3 from a third semiconductor substrate, and the memory semiconductor device 10M-4 from a fourth semiconductor substrate, and stacking up the memory semiconductor devices 10M-1 through 10M-4 in the predetermined order.

Eighth Embodiment

Next, a memory three-dimensional semiconductor device 50M-A in accordance with an eighth embodiment of the present invention is described.

Figure 44:
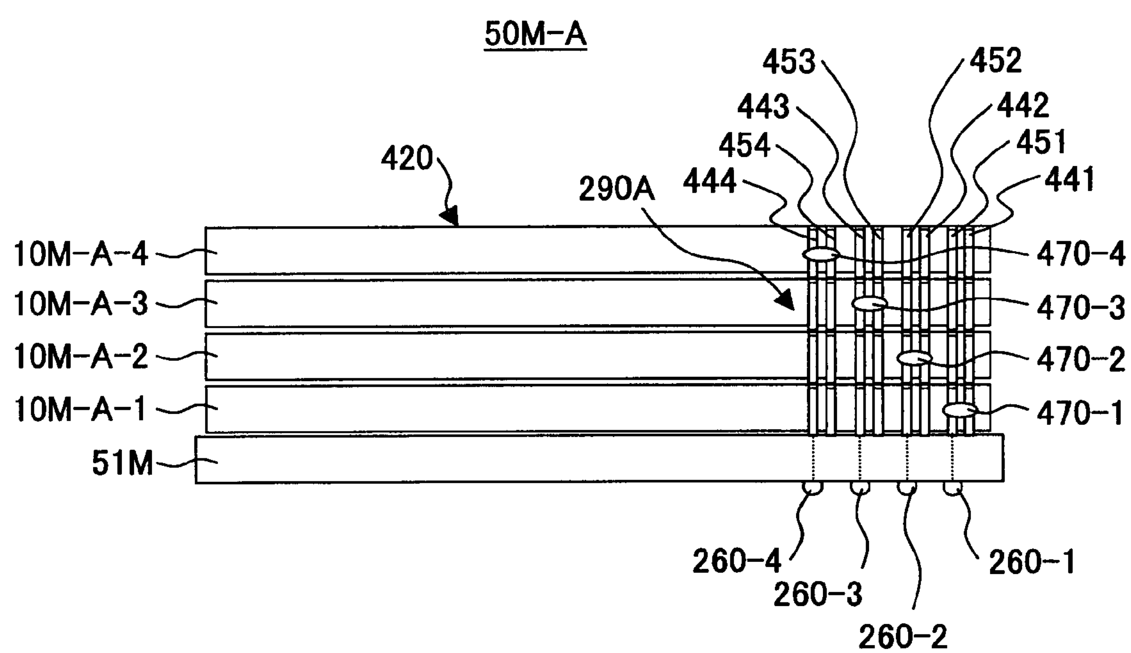
FIG. 44 illustrates a memory three-dimensional semiconductor device in accordance with an eighth embodiment of the present invention.

In the memory three-dimensional semiconductor device 50M-A shown in FIG. 44, memory semiconductor devices 10M-A-1 through 10M-A-4 are electrically connected to one another and are stacked on one another. The memory three-dimensional semiconductor device 50M-A has a memory semiconductor device designating unit 290A formed on a side surface. The memory semiconductor device designating unit 290A is to designate a memory semiconductor device to perform data read and write operations among the memory semiconductor devices 10M-A-1 through 10M-A-4.

Although not shown in the drawings, the other electrodes of each of the memory semiconductor devices 10M-A-1 through 10M-A-4 are embedded electrodes 115. The embedded electrodes 115 of the memory semiconductor devices 10M-A-1 through 10M-A-4 are connected to one another when the memory semiconductor devices 10M-A-1 through 10M-A-4 are stacked as described in the foregoing embodiment.

Figure 48:
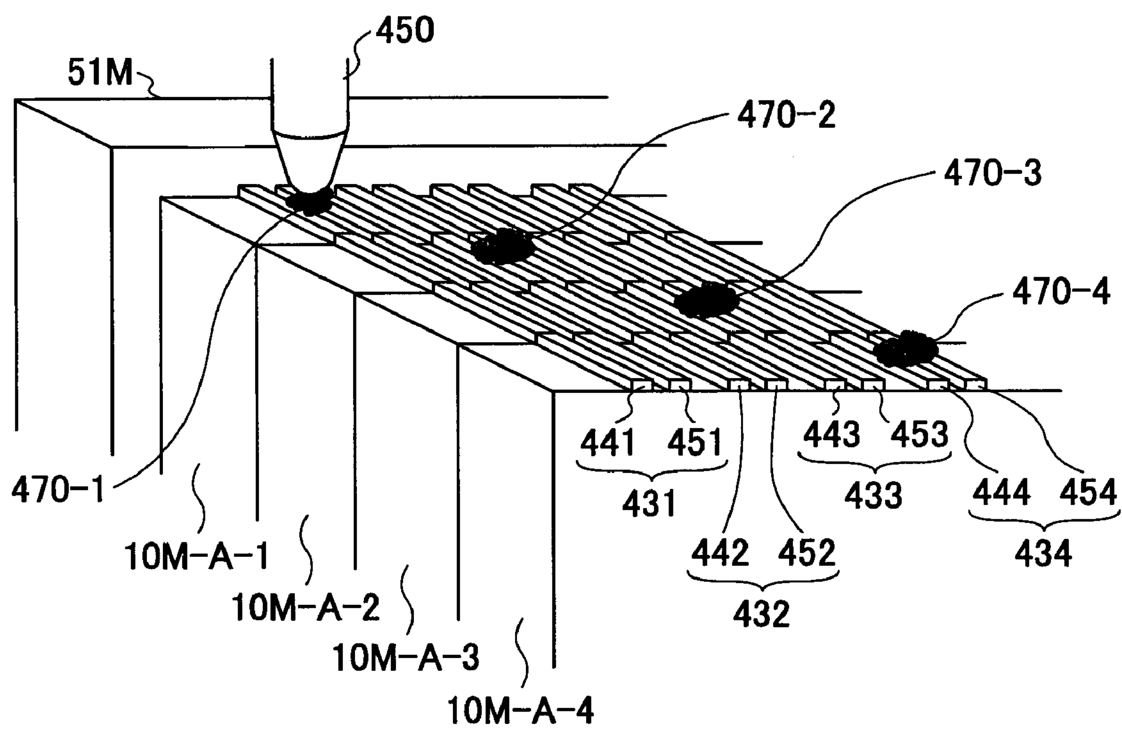
FIG. 48 illustrates the external select bump terminal/select terminal connecting process.

The memory semiconductor devices 10M-A-1 through 10M-A-4 are semiconductor chips that have the same structures and are picked up from a single semiconductor substrate. After the four memory semiconductor devices 10M-A-1 through 10M-A-4 are stacked up, the memory semiconductor device designating unit 290A is formed through an external select bump terminal/select terminal connecting process, so that the external select bump terminals 260-1 through 260-4 are electrically connected only to the select terminals 210-1 through 210-4, respectively, as shown in FIG. 48.

Figure 45:
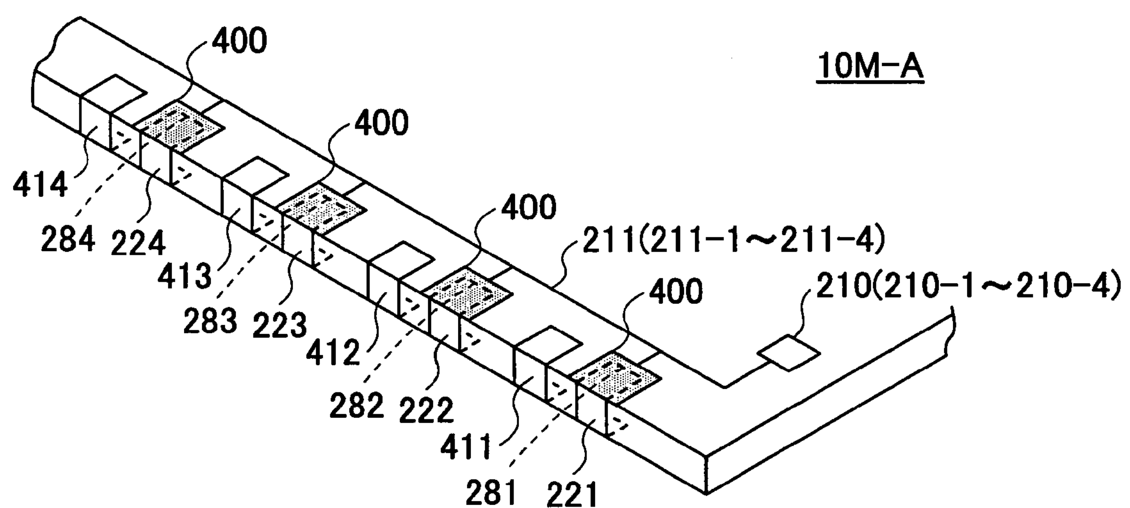
FIG. 45 is a perspective view of part of a memory semiconductor device that constitutes the memory three-dimensional semiconductor device of FIG. 44.
Figure 46:
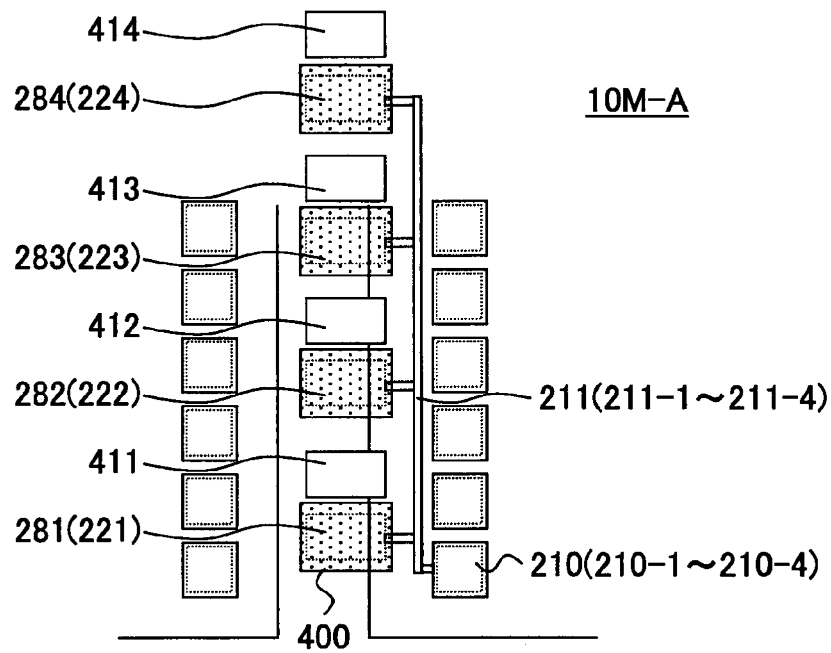
FIG. 46 is a plan view of the memory semiconductor device of FIG. 45.

Part of a memory semiconductor device 10M-A that forms the memory three-dimensional semiconductor device 50M-A is shown in FIGS. 45 and 46. The memory semiconductor device 10M-A differs from the memory semiconductor device 10M-1 shown in FIG. 25 in the following points 1), 2), and 3).

1) The wire 211-1 is not cut off;

2) The first electrode parts 281 through 284 of the electrode pad structures 221 through 224 are covered with an insulating film 400;

3) Auxiliary electrode pad structures 411 through 414 are provided next to the electrode pad structures 221 through 224. The auxiliary electrode pad structures 411 through 414 have the same structures as the electrode pad structures 221 through 224.

Figure 47:
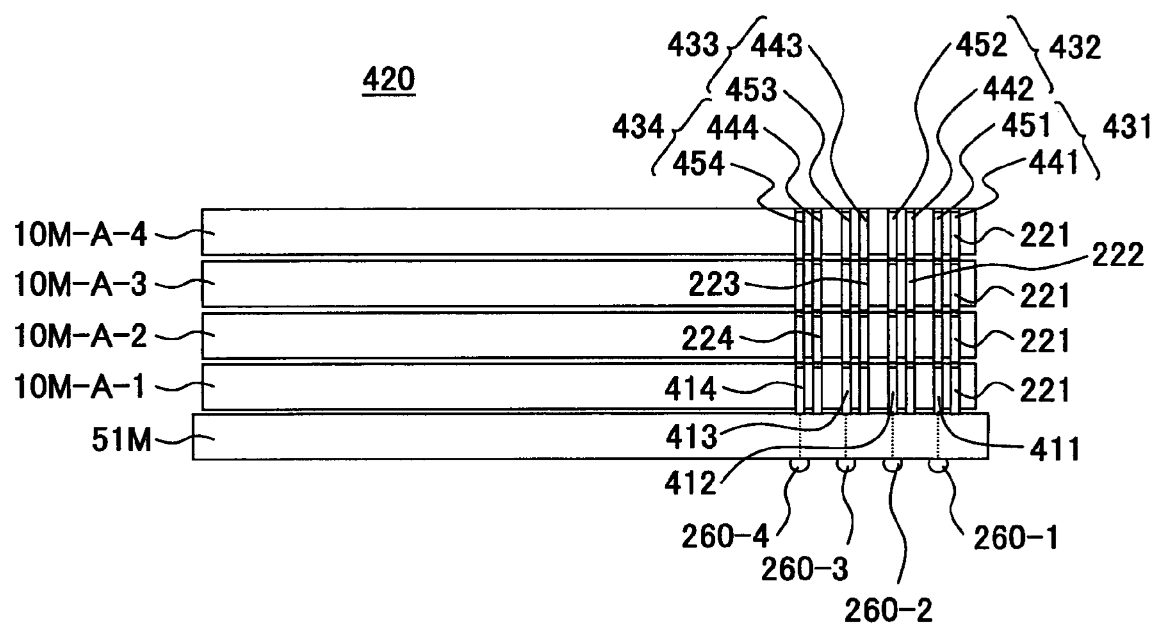
FIG. 47 illustrates a stacked structure that is formed by staking up the memory semiconductor devices of FIG. 45.

Four memory semiconductor devices 10M-A are stacked on the interposer 51M, so as to form a stacked structure 420 shown in FIG. 47.

Four pairs of wires 431 through 434 are formed on a side surface of the stacked structure 420. The pairs of wires 431 through 434 are formed with first side-surface wires 441 through 444 and second side-surface wires 451 through 454.

As shown in FIG. 47, the first side-surface wire 441 is formed with the four vertically-aligned electrode pad structures 221 of the memory semiconductor devices 10M-A-1 through 10M-A-4 that constitute the stacked structure 420. In the first side-surface wire 441, the insulating film 400 shown in FIG. 46 insulates each two vertically-neighboring electrode pad structures 221 from each other. The other first side-surface wires 442, 443, and 444 are also formed with the vertically-aligned electrode pad structures 222 through 224 of the memory semiconductor devices 10M-A-1 through 10M-A-4, respectively. In each of the first side-surface wires 442, 443, and 444, an insulating film 400 insulates each two vertically-neighboring electrode pad structures from each other among the electrode pad structures 222, 223, and 224.

The second side-surface wire 451 is formed with the vertically-aligned auxiliary electrode pad structures 411 of the respective memory semiconductor devices 10M-A. Among the auxiliary electrode pad structures 411, each two vertically-neighboring auxiliary electrode pad structures 411 are electrically connected. The other second side-surface wires 452, 453, and 454 are also formed with the vertically-aligned auxiliary electrode pad structures 412 through 414, and each two vertically-neighboring auxiliary electrode pad structures among the auxiliary electrode pad structures 412 through 414 are electrically connected.

The electrode pad structures 411 through 414 of the lowermost memory semiconductor device 10M-A-1 are electrically connected to the external select bump terminals 260-1 through 260-4.

In this structure, the external select bump terminal/select terminal connecting process is carried out by applying silver paste to predetermined parts of the wires 431 through 434 with a silver paste dispenser 450, and performing thermal hardening to electrically connect the wires 431 through 434, as shown in FIG. 48.

As shown in FIG. 44, in the memory three-dimensional semiconductor device 50M-A, the first side-surface wire 441 and the second side-surface wire 451 are short-circuited to each other with a silver paste 470-1 on the side surface of the memory semiconductor device 10M-A-1. Likewise, the first side-surface wire 442 and the second side-surface wire 452 are short-circuited to each other with a silver paste 470-2 on the side surface of the memory semiconductor device 10M-A-2. Also, the first side-surface wire 443 and the second side-surface wire 453 are short-circuited to each other with a silver paste 470-3 on the side surface of the memory semiconductor device 10M-A-3. The first side-surface wire 444 and the second side-surface wire 454 are short-circuited to each other with a silver paste 470-4 on the side surface of the memory semiconductor device 10M-A-4.

In this structure, the external select bump terminal 260-1 is electrically connected only to the select terminal 210-1 among the select terminals 210-1 through 210-4 via the second side-surface wire 451 (the electrode pad structure 411), the silver paste 470-1, the first side-surface wire 441 (the electrode pad structure 221), and the wire 211-1. Likewise, the external select bump terminal 260-2 is electrically connected only to the select terminal 210-2 via the second side-surface wire 452, the silver paste 470-2, the first side-surface wire 442, and the wire 211-2. The external select bump terminal 260-3 is electrically connected only to the select terminal 210-3 via the second side-surface wire 453, the silver paste 470-3, the first side-surface wire 443, and the wire 211-3. The external select bump terminal 260-4 is electrically connected only to the select terminal 210-4 via the second side-surface wire 454, the silver paste 470-4, the first side-surface wire 444, and the wire 211-4.

The memory three-dimensional semiconductor device 50M-A is formed to utilize the side surface of the stacked structure 420, as shown in FIG. 44. Accordingly, the memory three-dimensional semiconductor device 50M-A is small in size on a plan view, and is more compact than a conventional three-dimensional semiconductor device.

Also, the stacked structure 420 is formed by stacking up chips that are randomly picked up from different silicon wafers, regardless of any stacking order. Thus, the memory three-dimensional semiconductor device 50M-A can be easily produced.

The memory semiconductor device designating unit 290A is formed by carrying out the external select bump terminal/select terminal connecting process after the formation of the stacked structure 420. Accordingly, there is a certain degree of freedom in the correspondence between the external select bump terminals 260-1 through 260-4 and the select terminals 210-1 through 210-4. Thus, the memory three-dimensional semiconductor device 50M-A is suitable for manufacturing a small number of memory three-dimensional semiconductor devices with different structures.

Further, the laser cutting process is not necessary in the external select bump terminal/select terminal connecting process in this embodiment. Because of this, the memory three-dimensional semiconductor device 50M-A can be more easily produced.

Ninth Embodiment

Figure 49:
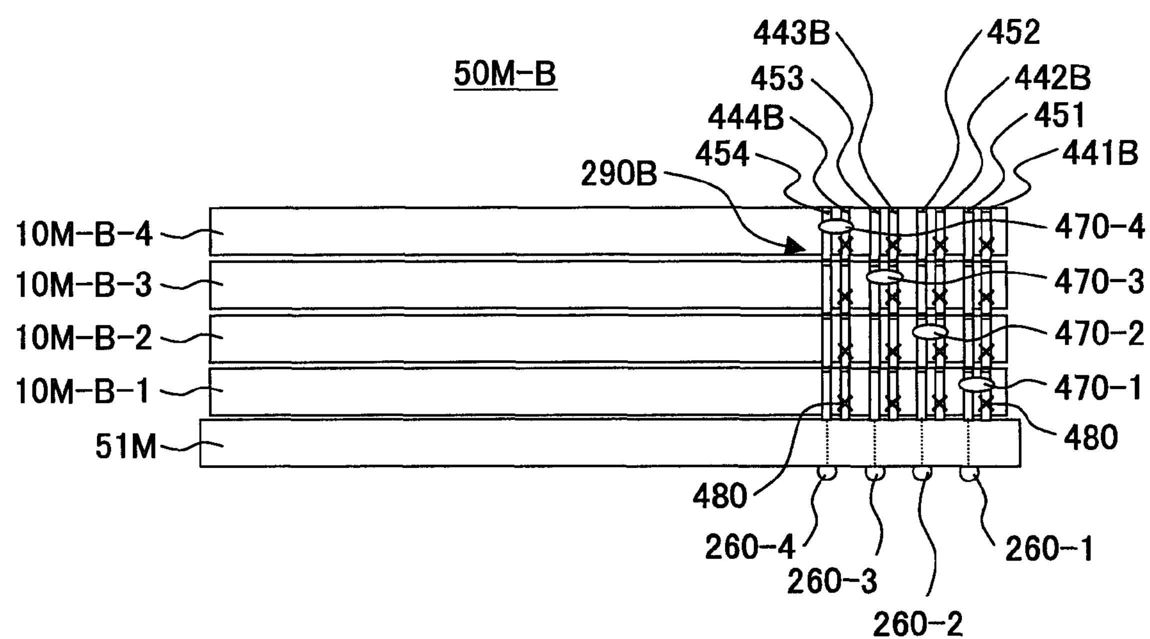
FIG. 49 illustrates a memory three-dimensional semiconductor device in accordance with a ninth embodiment of the present invention.

A memory three-dimensional semiconductor device 50M-B in accordance with a ninth embodiment of the present invention is shown in FIG. 49.

The memory three-dimensional semiconductor device 50M-B has memory semiconductor devices 10M-B-1 through 10M-B-4 electrically connected to one another and stacked on one another. The memory three-dimensional semiconductor device 50M-B also has a memory semiconductor device designating unit 290B on its side surface. The memory semiconductor device designating unit 290B is to designate a memory semiconductor device to perform data read and write operations among the memory semiconductor devices 10M-B-1 through 10M-B-4.

The memory semiconductor devices 10M-B-1 through 10M-B-4 have the same structures as the memory semiconductor devices 10M-A-1 through 10M-A-4, except that the insulating film 400 shown in FIGS. 45 and 46 is not employed.

First side-surface wires 441B through 444B are electrically connected to one another over the entire length, like the second side-surface wires 451 through 454.

The external select bump terminal/select terminal connecting process includes the step of performing thermosetting with a silver paste dispenser that applies silver paste on predetermined locations, and the step of cutting the first side-surface wires 441B through 444B at predetermined locations with a laser.

In the memory semiconductor device designating unit 290B, the first side-surface wires 441B through 444B are short-circuited to the second side-surface wires 451 through 454 with the silver pastes 470-1 through 470-4. Furthermore, the first side-surface wires 441B through 444B of the respective memory semiconductor devices 10M-B-1 through 10M-B-4 are cut off with a laser at the locations denoted by "X" and reference numeral 480. With the memory semiconductor device designating unit 290B, the external select bump terminals 260-1 through 260-4 are electrically connected to the select terminals of the respective memory semiconductor devices 10M-B-1 through 10M-B-4.

The stacked memory semiconductor devices 10M-B-1 through 10M-B-4 may not include the second electrode part 291 of the electrode pad structure 221 that extends onto the bottom surface of the semiconductor substrate. In that case, the laser cutting denoted by reference numeral 480 in FIG. 49 is not necessary.

Like the memory three-dimensional semiconductor device 50M-A, the memory three-dimensional semiconductor device 50M-B is small in size on a plan view and is more compact than a conventional three-dimensional semiconductor device. Accordingly, it is easy to produce the memory three-dimensional semiconductor device 50M-B. Thus, the memory three-dimensional semiconductor device 50M-B is suitable for manufacturing a small number of memory three-dimensional semiconductor devices with different structures.

It should be noted that the present invention is not limited to the embodiments specifically disclosed above, but other variations and modifications may be made without departing from the scope of the present invention.

What is claimed is:

1. A semiconductor device comprising:

a substrate that has first and second surfaces;

an integrated circuit unit, an electrode pad, and a select terminal that are formed on the first surface;

a lead-out unit that has one end electrically connected to the bottom surface of the electrode pad and the other end exposed to the second surface of the substrate, the electrode pad being electrically extended to the second surface of the substrate, the lead-out unit being formed in a hole that is in the form of a concavity extending from the second surface of the substrate and penetrating the substrate, the bottom surface of the electrode pad being exposed through the bottom of the hole; and a plurality of side-surface electrode pads that are formed on a side surface of the substrate, one of said plurality of side-surface electrode pads being electrically connected to the select terminal, wherein said substrate carries, on said first surface thereof, a wiring pattern connecting said one of said plurality of side-surface electrode pads to said select terminal.

2. A three-dimensional semiconductor device comprising:

a plurality of semiconductor devices that are stacked on one another, the plurality of semiconductor devices including first and second semiconductor devices, the plurality of semiconductor devices each comprising:

a substrate that has first and second surfaces;

an integrated circuit unit and an electrode pad and a select terminal that are formed on the first surface;

a hole extending through the substrate from the second surface and reaching a rear surface of the electrode pad on the first surface;

a lead-out unit embedded inside the hole in electrical connection to the rear surface of the electrode pad, such that a surface of the lead-out unit projects slightly from said second surface;

a first wiring formed on the first surface of the substrate in electrical connection with the electrode pad;

a second wiring formed on the second surface of the substrate in electrical connection with the lead out unit, said second wiring extending continuously from said lead out unit to a flat area of said second surface of said substrate; and a plurality of side-surface electrode pads that are formed on a side surface of the substrate, one of said plurality of side-surface electrode pads being electrically connected to the select terminal, said substrate carrying, on said first surface thereof, a selection wiring pattern connecting said one of said plurality of side-surface electrode pads to the select terminal, the electrode pads of the semiconductor devices being electrically connected to one another such that the first wiring of the first semiconductor device is connected to the second wiring of the second semiconductor device stacked on the first semiconductor device.

3. The three-dimensional semiconductor device as claimed in claim 2, wherein the first semiconductor device and the second semiconductor device have different sizes.

4. The semiconductor device as claimed in claim 2, wherein the lead-out unit is formed with a conductive material that fills the hole.

5. The semiconductor device as claimed in claim 2, wherein the lead-out unit is formed with a conductor material that is formed along the inner wall surface of the hole.

6. The semiconductor device as claimed in claim 2, wherein the hole in the substrate has a tapered structure, having a smaller diameter at the bottom than the diameter of the opening on the second surface.

7. A three-dimensional semiconductor device comprising:

a plurality of semiconductor devices that are stacked on one another, the semiconductor devices each comprising:

a substrate that has first and second surfaces;

an integrated circuit unit, an electrode pad, and a select terminal that are formed on the first surface; and a lead-out unit that has one end electrically connected to the bottom surface of the electrode pad and the other end exposed to the second surface of the substrate, the electrode pad being electrically led out to the second surface of the substrate, the lead-out unit being formed in a hole that is in the form of a concavity extending from the second surface of the substrate and penetrating the substrate, the bottom surface of the electrode pad being exposed through the bottom of the hole;

a plurality of side-surface electrode pads that are formed on a side surface of the substrate, one of said plurality of side-surface electrode pads being electrically connected to the select terminal; and a selection wiring pattern provided on said first surface of said substrate, said selection wiring pattern connecting one of said plurality of side-surface electrode pads to said select terminal, the electrode pads of the semiconductor devices being electrically connected to one another, the three-dimensional semiconductor device further comprising:

a plurality of external select terminals to which a signal for designating a semiconductor device among the semiconductor devices is input; and a semiconductor device designating unit that includes, for each of said plurality of external select terminals, a part that electrically connects a group of the side-surface electrode pads of said respective semiconductor devices aligned to said external terminal, the side-surface electrode pads, the semiconductor device designating unit electrically connecting each of the external select terminals only to the select terminal of a designated semiconductor device among the semiconductor devices, the semiconductor device designating unit being located on a side surface of the three-dimensional semiconductor device.

8. The three-dimensional semiconductor device as claimed in claim 7, wherein:

each of the stacked semiconductor devices is part of the semiconductor device designating unit, the stacked semiconductor devices having semiconductor designating parts that are different from one another; and the semiconductor device designating unit is formed by electrically connecting the semiconductor designating parts of the stacked semiconductor devices.

9. The three-dimensional semiconductor device as claimed in claim 7, wherein:

each of the stacked semiconductor devices is part of the semiconductor device designating unit, the stacked semiconductor devices having semiconductor designating parts that are different from one another; and the semiconductor device designating unit is formed by electrically connecting the semiconductor designating parts of the stacked semiconductor devices, and short-circuiting or cutting off a predetermined portion, or short-circuiting and cutting off a predetermined portion.

* * * * *